(12) United States Patent
Kawamura et al.

(10) Patent No.: US 7,714,233 B2
(45) Date of Patent: May 11, 2010

(54) PRINTED WIRING BOARD

(75) Inventors: Yoichiro Kawamura, Ibi-gun (JP); Shigeki Sawa, Ibi-gun (JP); Katsuhiko Tanno, Ibi-gun (JP); Hironori Tanaka, Ibi-gun (JP); Naoaki Fujii, Ibi-gun (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

(21) Appl. No.: 11/476,557

(22) Filed: Jun. 29, 2006

(65) Prior Publication Data

US 2007/0096327 A1    May 3, 2007

(30) Foreign Application Priority Data

Jun. 30, 2005    (JP)    ............... 2005-192862

(51) Int. Cl.
    *H05K 1/16*    (2006.01)
(52) U.S. Cl. ...................... 174/260; 174/261
(58) Field of Classification Search ................ 174/260, 174/261; 257/778
    See application file for complete search history.

(56) References Cited

U.S. PATENT DOCUMENTS

| | | | |
|---|---|---|---|
| 5,329,423 A | | 7/1994 | Scholz |
| 6,046,910 A * | | 4/2000 | Ghaem et al. ............... 361/760 |
| 6,256,207 B1 * | | 7/2001 | Horiuchi et al. ............. 361/760 |
| 6,443,351 B1 * | | 9/2002 | Huang et al. ................ 228/103 |
| 6,719,185 B2 * | | 4/2004 | Suzuki ..................... 228/173.1 |
| 6,753,480 B2 | | 6/2004 | Maa et al. |
| 6,809,268 B2 * | | 10/2004 | Hayashi et al. ............. 174/260 |
| 6,933,448 B2 * | | 8/2005 | Maa et al. ................... 174/255 |
| 7,087,991 B2 * | | 8/2006 | Chen et al. .................. 257/700 |
| 7,189,927 B2 * | | 3/2007 | Sakuyama ................... 174/261 |
| 7,279,771 B2 | | 10/2007 | Sunohara et al. |
| 7,452,797 B2 | | 11/2008 | Kukimoto et al. |
| 2003/0214795 A1 | | 11/2003 | Sakuyama |
| 2004/0209451 A1 | | 10/2004 | Kukimoto et al. |
| 2006/0244142 A1 * | | 11/2006 | Waidhas et al. ............. 257/738 |
| 2007/0086147 A1 | | 4/2007 | Kawamura et al. |

FOREIGN PATENT DOCUMENTS

| | | |
|---|---|---|
| JP | 59-996 | 1/1984 |
| JP | 5-121411 | 5/1993 |
| JP | 11-40908 | 2/1999 |
| JP | 2002-208778 | 7/2002 |
| JP | 2002-217531 | 8/2002 |
| JP | 2004-179578 | 6/2004 |
| JP | 2004-207370 | 7/2004 |
| JP | 2004-319676 | 11/2004 |

* cited by examiner

*Primary Examiner*—Ishwarbhai B Patel
(74) *Attorney, Agent, or Firm*—Oblon, Spivak, McClelland, Maier & Neustadt, L.L.P.

(57) ABSTRACT

A printed wiring board including a wiring substrate provided with at least one conductor circuit, a solder resist layer formed on the surface of the wiring substrate, covering the at least one conductor circuit, conductor pads formed on a part of the at least one conductor circuit exposed from respective openings provided in the solder resist layer for mounting electronic parts, and solder bumps formed on the respective conductor pads. The ratio (H/D) of a height H of the solder bumps from solder resist layer surface to an opening diameter of the openings are made to be about 0.55 to about 1.0 with the pitch of the openings provided in the solder resist layer of about 200 µm or less.

2 Claims, 9 Drawing Sheets

Conductor circuit 158 — Amount of depression — Thickness of the conductor circuit 158

Conductor circuit 158 — Amount of projection — Thickness of the conductor circuit 158

Connecting pad

Connecting pad x·y=Connecting pad area

PRINTED WIRING BOARD

The present invention is an application claiming priority of JP 2005-192862 filed with Japanese Patent Office on Jun. 30, 2005, and the disclosure of which is incorporated herein by reference in its entirety.

TECHNICAL FIELD

The present invention relates to a printed wiring board for mounting electronic parts such as capacitors, IC and the like on the outer layer, more particularly, a printed wiring board adaptable to narrow pitching of solder bump for mounting electronic parts.

BACKGROUND ART

Recent years, high performance is remarkable in electronics represented by portable telephones and communication terminals. And, for these electronics is used a printed wiring board having IC chips mounted thereon. As a method of mounting IC chips on a printed wiring board, a flip chip type of directly mounting IC chips on the surface of a printed wiring board is widely employed. As such a printed wiring board, there has been known the one comprising a core substrate, a build-up layer formed on the core substrate and connecting pads for mounting an IC chip through a solder bump on the surface of the build-up layer.

Here, as a printed wiring board, use are made of epoxy resin, BT (bismaleimide triazine) resin phenol resin and the like formed with reinforcement such as glass fiber or the like. The thermal expansion coefficient of these core substrates is about 12-20 ppm/° C. (30-200° C.) and about 4 times larger than that (about 3.5 ppm/° C.) of silicon of the IC chip package.

Therefore, the flip-chip type has, in case of repeating temperature change with heat generation, the possibility of destroying the solder bump due to differences in thermal expansion and heat contraction between the IC chip and the core substrate. For solving such problem, there is proposed a method of interposing an interposer having a thermal expansion coefficient between the printed wiring board and the IC (refer to Japanese unexamined patent application No. 59-996).

BRIEF SUMMARY OF THE INVENTION

According to one embodiment of the present invention, there is provided a printed wiring board comprising a wiring substrate provided with at least one conductor circuit, a solder resist layer formed on the surface of the wiring substrate, covering the at least one conductor circuit, conductor pads formed on a part of the at least one conductor circuit exposed from respective openings provided in the solder resist layer for mounting electronic parts, and solder bumps formed on the respective conductor pads, wherein the conductor pads are arranged with a pitch of about 200 µm or less and the ratio (H/D) of a height H of the solder bump from the surface of the solder resist layer to an opening diameter D of the opening is about 0.55 to about 1.0.

According to other embodiment of the present invention, there is provided a printed wiring board comprising a wiring substrate provided with at least one conductor circuit, a solder resist layer formed on the surface of the wiring substrate, covering the at least one conductor circuit, conductor pads formed on a part of the at least one conductor circuit exposed from the respective openings provided in the solder resist for mounting electronic parts, solder bumps formed on the respective conductor pads, and an under fill material or resin 100 for sealing a gap or space defined between electronic parts mounted through the solder bumps and the solder resist layer, wherein the conductor pads are arranged with a pitch of about 200 µm or less and the ratio (H/D) of a height H of the solder bump from the surface of the solder resist layer to an opening diameter D of the opening is about 0.55 to about 1.0.

In the embodiment of the present invention, the surface of the solder resist layer can be flattened at least in an electronic part mounting region, and it is desirable that maximum surface roughness (uneven amount) of the flattened surface (1st uneven face) is made about 0.8 µm to about 3.0 µm.

Further, in the embodiment of the present invention, the surface of the flattened solder resist layer can be further roughened, and it is desirable that surface roughness of the roughened surface (2nd uneven face) of the solder resist layer is smaller than the maximum surface roughness of the flattened surface and about 0.2 µm to about 0.5 µm at an arithmetic mean roughness (Ra).

Further, in the embodiment of the present invention, it is desirable that the conductor pad defined as a part of the conductor circuit exposed from the opening provided in the solder resist layer is formed in the form of a filled-via which is defined by a plated conductor completely filled within an opening provided in an interlaminar insulative resin layer positioned at the outermost layer, and an uneven amount of the filled-via surface exposed from the interlaminar insulative resin layer surface is about −5 µm to about +5 µm in relation to the thickness of the conductor circuit formed on the interlaminar insulative resin layer.

Further, in the embodiment of the present invention, "conductor pad" is defined as a part of the conductor circuit exposed from the opening provided in the solder resist layer. The conductor circuit can be, for instance, formed in the form (connecting pad) of utilizing a part of the conductor circuit, the form of a viahole (including the filled-via in which plated conductor is completely filled within the opening provided in the resin insulating layer) or the form consisting of the viahole and the conductor circuit, so that in abroad sense, it indicates a part of the conductor circuit including the connecting pads and the viaholes.

Further, in the embodiment of the present invention, "opening diameter (D)" of the opening provided in the solder resist layer means a "diameter" of the opening when the opening side wall is not tapered, and means a diameter (of the opening upper part) of the opening exposed on the solder resist layer surface when the opening side wall is tapered.

Further, in the embodiment of the present invention, "maximum surface roughness" means, as schematically shown in FIG. 8, in the electronic part mounting region, the maximum value in differences X1, X2, X3, X4, X5, . . . between the height of the solder resist layer on the conductor pad or the conductor circuit and that of the solder resist layer on an adjacent conductor pad non-forming portion or a conductor circuit non-forming portion.

Further, "arithmetic mean roughness" means arithmetic mean roughness (Ra) prescribed in JIS B0601, and the content of "arithmetic mean roughness" in JIS B0601 is incorporated herein by reference its entirety.

DETAILED DESCRIPTION OF THE EMBODIMENTS

Figure 9:
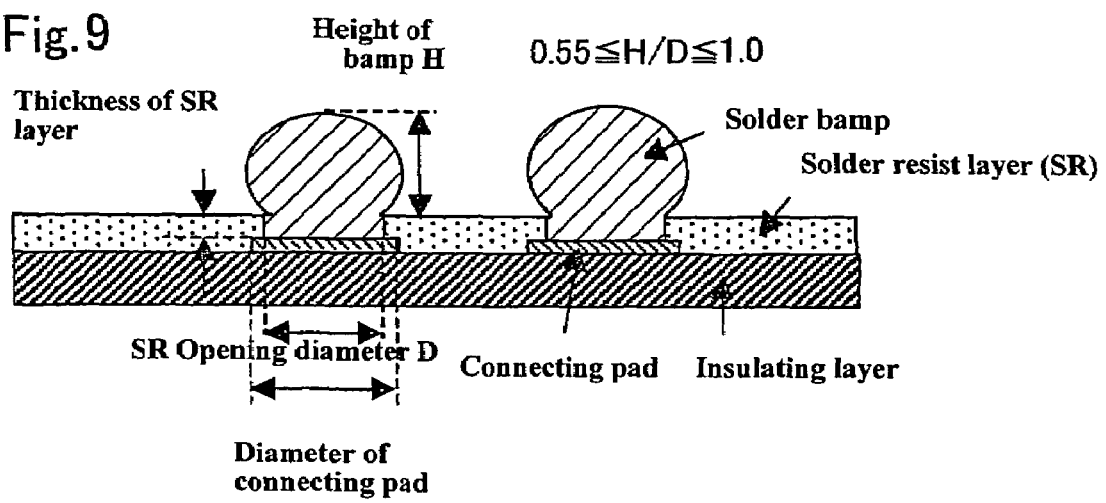
FIG. 9 is a schematic view explaining relation between bump height (H) and solder resist layer opening diameter (D) according to the present invention.

One embodiment of the printed wiring board according to the present invention will be described hereinafter. In the printed wiring board, as shown in FIG. 9, at least one opening is provided in a solder resist layer (SR layer) formed on the outermost layer of a wiring board, a part of the conductor circuit exposed from the at least one opening is formed as connecting pads for mounting electronic parts, the connecting pads are arranged with a pitch of about 200 μm or less, and solder bumps are formed on the respective connecting pads, and a ratio (H/D) of a height H from the solder resist layer surface of the solder bump formed on the connecting pad to the opening diameter D is within a range of about 0.55 to about 1.0.

In the embodiment of the present invention, for forming the respective solder bumps in the corresponding openings provided in the solder resist layer, it is desirable to use a novel method and a device for dropping solder balls having very fine particle diameter on the connecting pads through the corresponding openings of a ball aligning mask as described below, without employing a printing method with the use of a conventional mask.

First, a novel solder ball mounting method and a device thereof are used for manufacturing. As to the printed wiring board of the present invention, the construction of one embodiment is explained by referring to FIG. 1 and FIG. 2.

Figure 1:
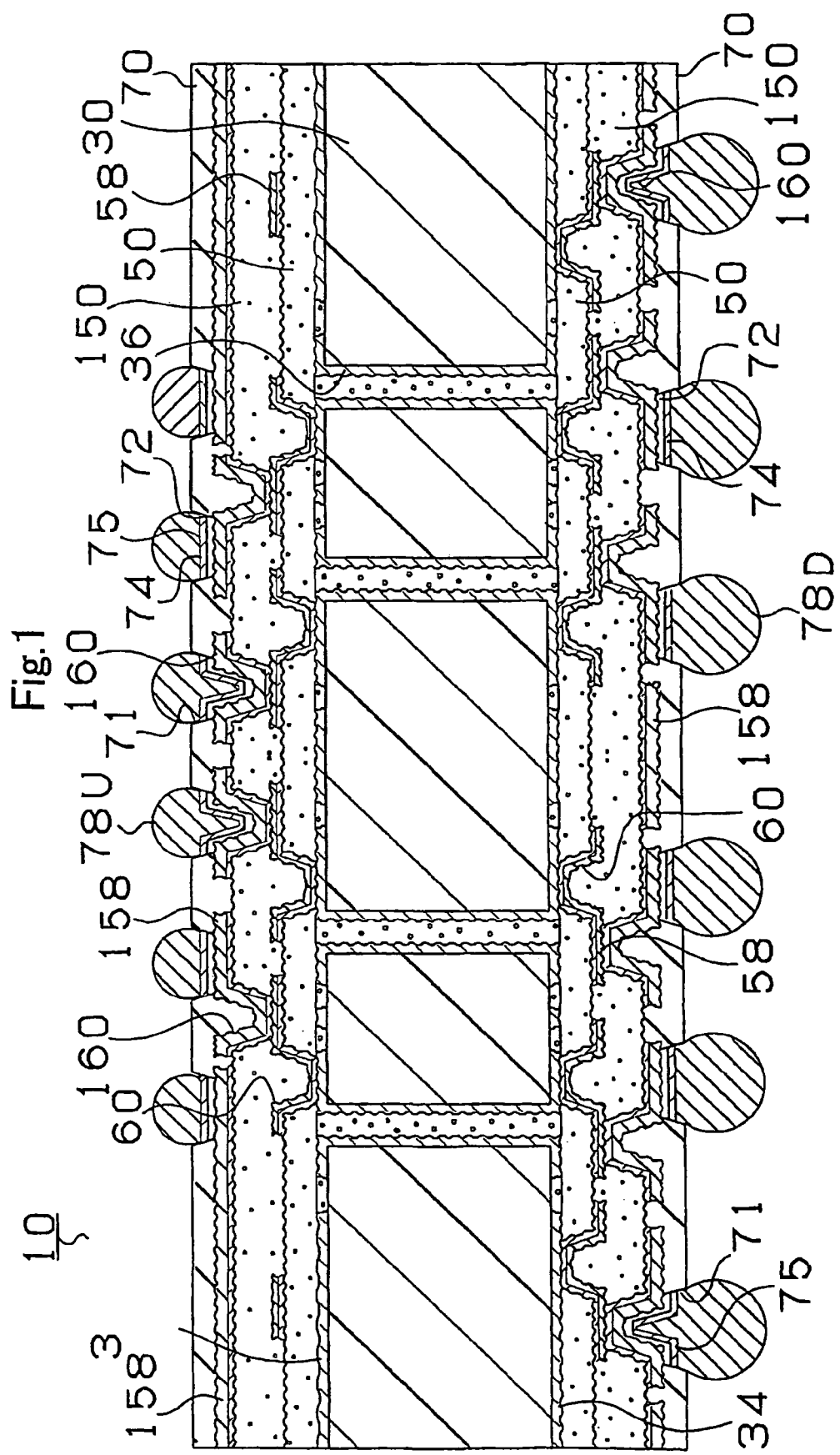
FIG. 1 is a sectional view of the printed wiring board according to the present invention.
Figure 2:
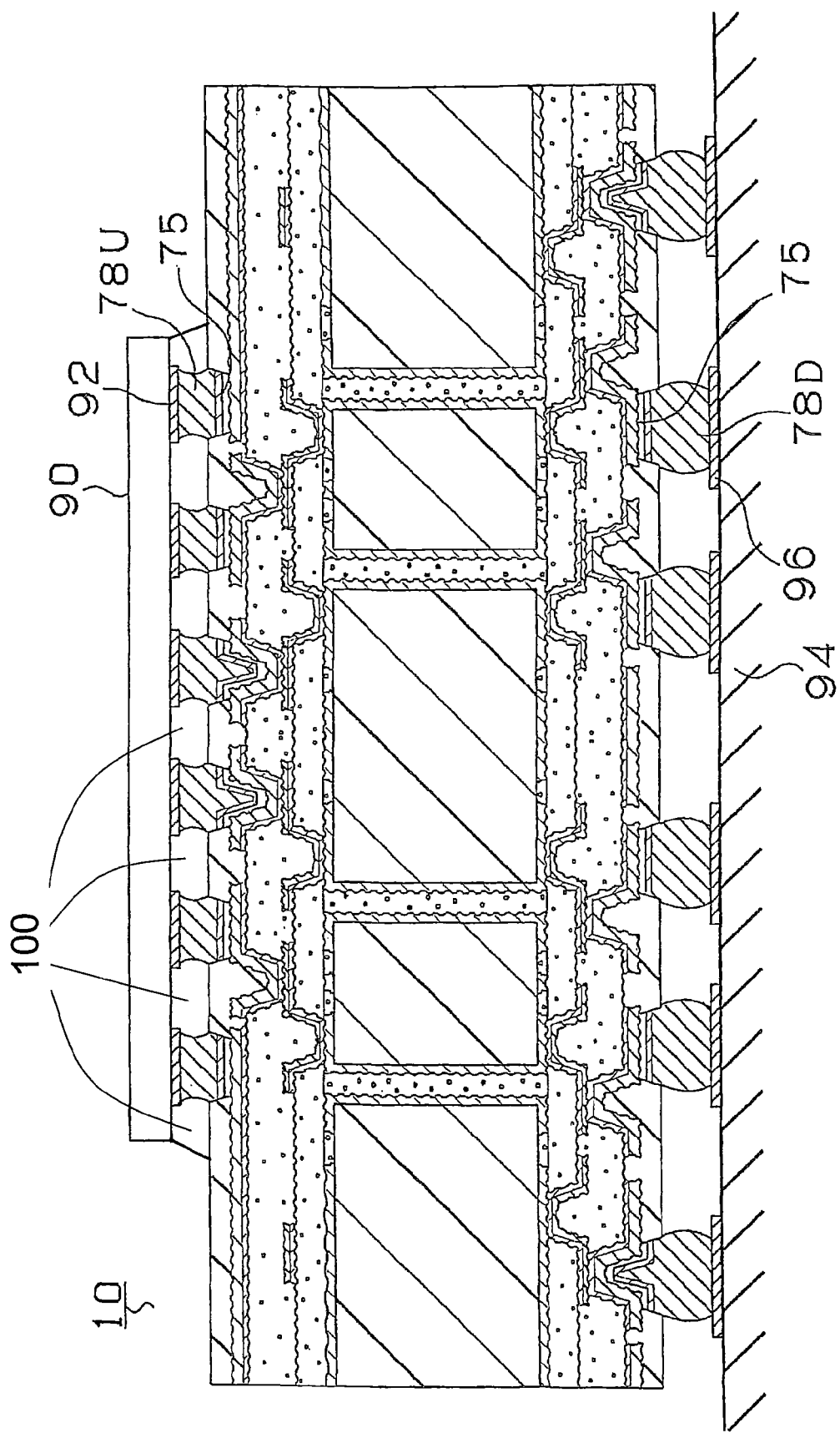
FIG. 2 is a sectional view showing a state of mounting an IC chip on the printed wiring board shown in FIG. 1 and placing on a daughter board.

FIG. 1 shows a sectional view of a printed wiring board 10, and FIG. 2 shows a state in which an IC chip 90 is mounted on the printed wiring board 10 and the printed wiring board 10 is mounted on a daughter board 94. As shown in FIG. 1, the printed wiring board 10 has a conductor circuit 34 formed on both surfaces of a core substrate 30, and the respective conductor circuits are electrically connected through a plated through hole 36.

Further, on the conductor circuit 34 of the core substrate 30 is formed a conductor circuit 58 forming a conductor circuit layer through an interlaminar insulative resin layer 50. The conductor circuit 58 is connected to the conductor circuit 34 through via hole 60. On the conductor circuit 58 is formed a conductor circuit 158 through an interlaminar insulative resin layer 150. The conductor circuit 158 is connected to the conductor circuit 58 through a via hole 160 formed in an interlaminar insulative resin layer 150.

A solder resist layer 70 is formed by covering the conductor circuit 158 and the via hole 160, and a connecting pad 75 is formed by forming a nickel plated layer 72 and a gold plated layer 74 on an opening 71 provided in the solder resist layer 71. On the connecting pad 75 of the top face is formed a solder bump 78U and on the connecting pad 75 of the bottom face is formed a BGA (ball grid array) 78D.

As shown in FIG. 2, the solder bump 78U on the upper side of the printed wiring board 10 is connected to an electrode 92 of the IC chip 90 to form an IC mounted printed wiring board, and the IC mounted printed wiring board is connected to a land 96 of a daughter board 94 through the BGA 78D.

According to the embodiment of the present invention, a height of the solder bump from the solder resist layer surface can be made comparatively large by making a ratio (H/D) of the height H of the solder bump to the opening diameter D of the opening about 0.55 or more, thereby easily deforming the solder bump in itself and enlarging volume (amount) of the solder. As a result, stress which can be absorbed by the solder is increased to improve connection reliability. On the other hand, the solder fused between the adjacent solder bumps is hard to move by making a ratio (H/D) of the height H of the solder bump to the opening diameter D of the opening about 1.0 or less, thereby hardly moving the solder molten between adjacent solder bumps to control irregular solder bump height and to prevent short-circuit of adjacent solder bumps. As a result, connection reliability and insulation reliability are improved.

Further, it is desirable that the surface of the solder resist layer corresponding to at least electronic parts mounting region is flattened. The solder resist layer and the solder bump are different in thermal expansion coefficient, so that there are produced repeatedly contraction and expansion at the boundary vicinity between the solder bump and the solder resist layer. And, when large unevenness is existent on the solder resist layer surface, i.e. flatness is worse, the volume of the solder resist layer in the bump vicinity is small to be easily broken. Therefore, by making flatness of the solder resist layer surface small to some extent, the volume of the solder resist layer where large stress is applied to is increased, bending portion where stress tends to concentrate is lessened, and heat cycle resistance can easily be improved.

The flattened surface of the solder resist layer is desirably about 0.8 to about 3.0 μm in maximum surface roughness. The reason is that when the maximum surface roughness is within a range of about 0.8 to about 3.0 μm, crack is hardly generated in the solder resist in the vicinity of the conductor pad, and air (void) is hard to enter into the under fill resin 100. As a result, insulation reliability and connection reliability are easily improved.

Further, in the embodiment of the present invention, it is desirable to further apply a roughening treatment to the flattened surface of the solder resist layer.

Wettability of the under fill resin 100 is easily improved by applying the roughening treatment to the surface of the solder resist layer flattened to some extent, so that under fill resin 100 can be filled in a narrow gap portion in the boundary vicinity between the solder resist layer and the solder bump so as to improve connection reliability.

It is desirable that the roughened surface of the solder resist layer is smaller than the maximum surface roughness of the flattened surface and about 0.2 to about 0.5 μm at an arithmetic mean roughness (Ra).

The reason is that when the arithmetic mean roughness Ra is made within a range of about 0.2 to about 0.5 μm, adhesion to the under fill resin 100 can be increased, and flux residue and cleaning residue are hardly remained on the solder resist surface. As a result, insulation reliability and connection reliability are easily improved.

Further, according to this embodiment, thinning and low cost can be estimated without requiring any interposer.

In the embodiment of the present invention, as understood from FIG. 1 and FIG. 2, among the connecting pads 75 provided on the upper surface of the substrate as conductor pads for mounting electronic parts, two connecting pads positioned at the center are formed in the form of a land right above the viahole 160, two connecting pads adjacent thereto are formed in the form of pads adjacent to the land of the viahole 160, and further two connecting pads positioned at both ends are formed in the form of a pad consisting of a part of a wiring pattern of the conductor circuit 158.

Figure 10A:
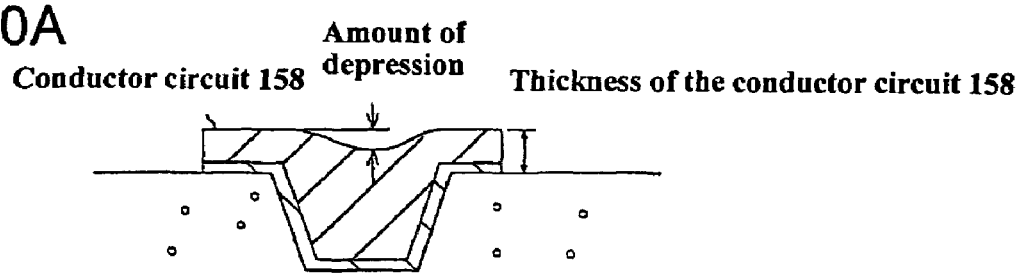
FIGS. 10A to 10B are schematic views explaining unevenness of the filled-via surface as a connecting pad.
Figure 10B:
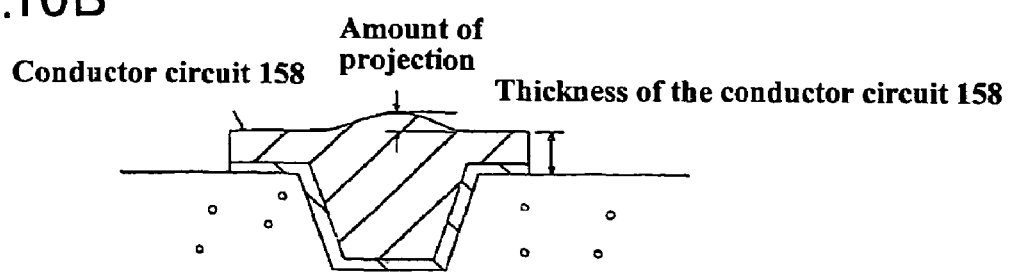

Further, among the connecting pads 75 formed on the lower surface of the substrate, two connecting pads positioned at both ends are formed in the form of a land right above the viahole 160, and four connecting pads positioned at the center are formed in the form of a pad adjacent to a land of the viahole 160, The viahole 160 as a connecting pad formed by the solder bump 78U is preferably a filled-via, and the uneven amount of the filled-via surface exposed from the surface of the interlaminar insulative resin layer 150 is, as shown in FIGS. 10A to 10B, desirably within a range of about −5 μm to about +5 μm in relation to the surface thickness of the conductor circuit 158. The reason why the depressed or protruded amount of the filled-via surface is restricted to a mentioned above is due to the fact that when the depressed amount is about 5 μm (−5 μm) or less, the number of contact point defined by the solder ball and the connecting pad consisting of the filled-via is secured, and wettability in case of forming the solder bump is easily improved, and entanglement of voids within the bump and missing bump can be controlled, while when the protruded amount of the filled-via surface is about 5 μm (+5 μm) or less, the thickness of the conductor circuit 158 is controlled not to become large but easily adaptable for fine patterning.

Further, the "electronic parts mounting region" in the embodiment of the invention substantially corresponds to a region (hereinafter, simply called as "connecting pad region") where conductor pads such as filled-via and the like for mounting electronic parts are provided.

Figure 11A:
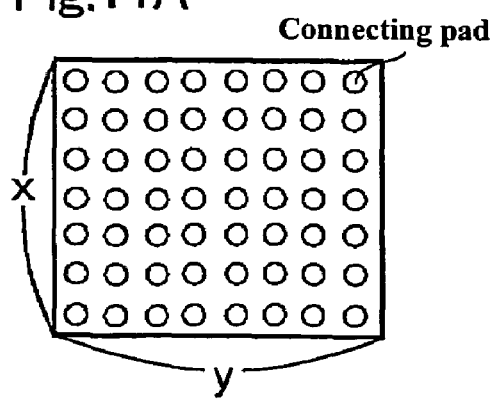
FIGS. 11A to 11B are schematic views explaining connecting pad region.
Figure 11B:
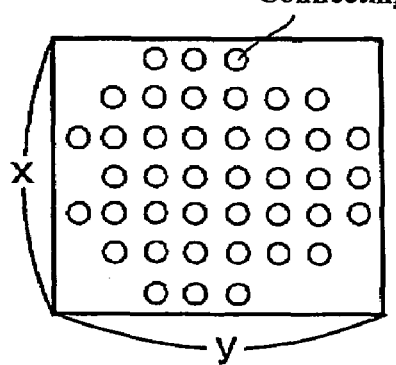

For example, FIG. 11A shows a state of aligning all of the outermost peripheral connecting pads along each side of a rectangle among grid-like aligned connecting pads, and FIG. 11B shows a state of not aligning a part of the outermost peripheral connecting pads along each side of the rectangle, however, in either case, when the connecting pad region is made rectangle, a rectangle region determined to minimize an area of the region enclosing all connecting pads is called as "connecting pad region".

Figure 3A:
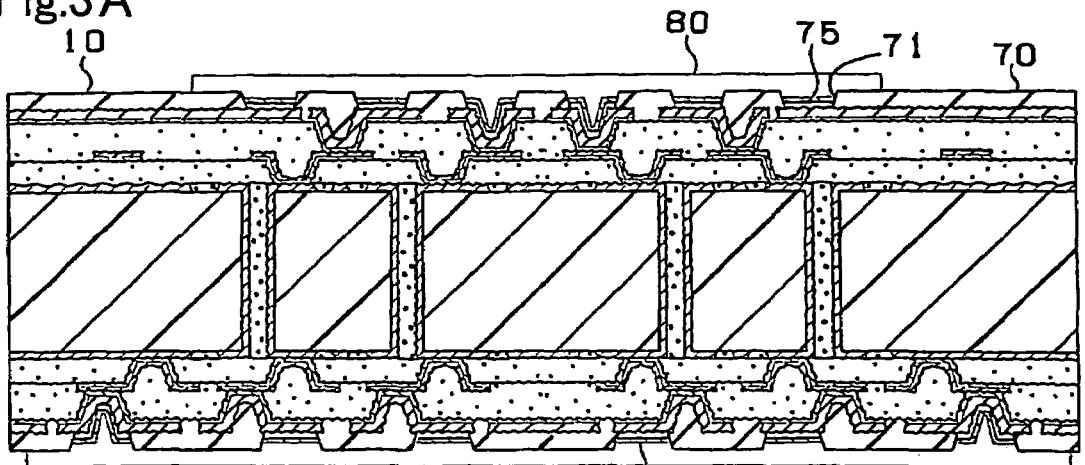
FIGS. 3A to 3C are views explaining steps of forming solder bumps on the printed wiring board.
Figure 3B:
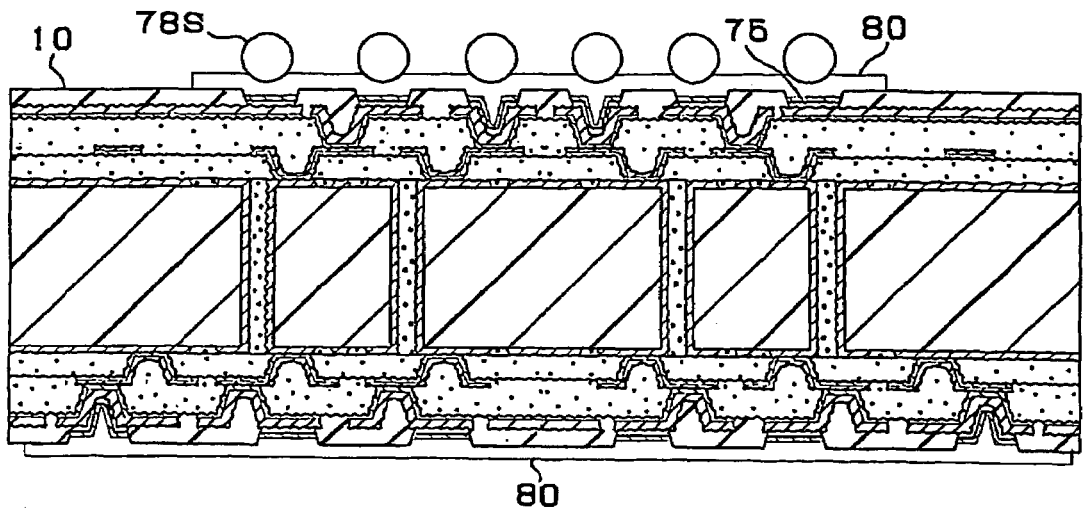
Figure 3C:
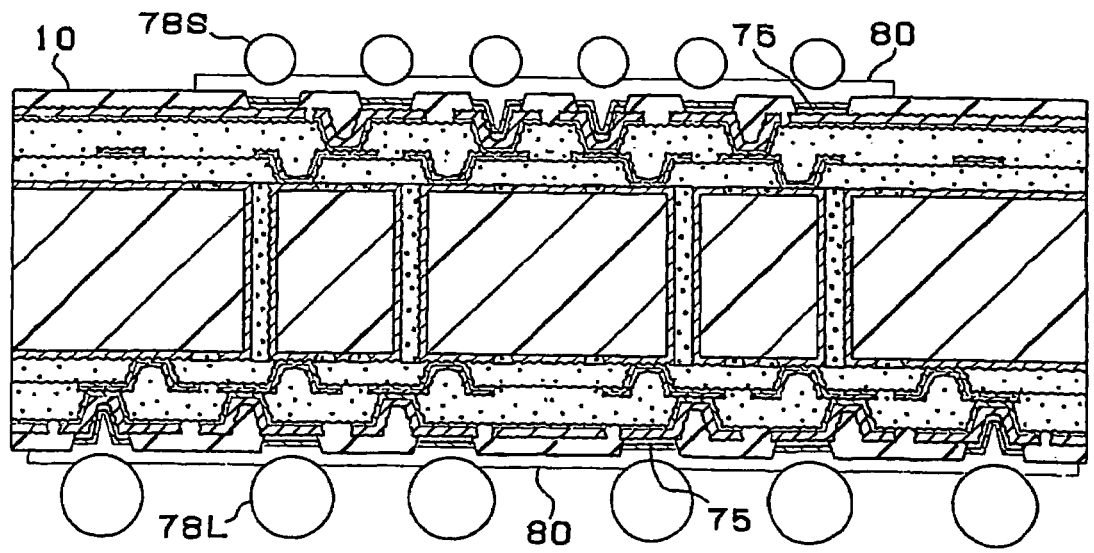

FIGS. 3A to 3C are views explaining the steps for forming the solder bumps on the printed wiring board 10 according to the present invention.

First, a flux layer 80 is formed for covering conductor pads formed in the openings 71 provided in the solder resist layer 70 on the top face side of the printed wiring board, i.e. the connecting pads 75 by a printing method (see FIG. 3A).

Next, on the connecting pads 75 on the top face side of the printed wiring board are mounted very small solder balls 78s (for example, made by Hitachi Metals or Tamura) with the use of a solder ball loader described later on (see FIG. 3B). Such solder ball is desirable to be about 40 μm or more and less than about 200 μm in diameter. When the diameter is made within such range, each solder ball easily drops on the corresponding connecting pad because it is not too light in weight, and the solder balls are easily assembled in a cylinder member, thereby to control the presence of connecting pads with no solder balls mounted thereon. In order to match for the fine patterning, the solder ball having a diameter of less than or equal to about 80 μm is desirable.

Thereafter, solder balls 78L of a usual diameter (250 μm) are adsorbed and placed on the connecting pads 75 on the bottom face side of the printed wiring board with the use of an adsorption head as described in Japanese Patent No. 1975429, for instance (see FIG. 3C).

Next, by heating in a reflow furnace to form, 500 pieces to 30,000 pieces of the solder bumps 78U are formed with a pitch of about 60 to about 200 μm on the top face side of the printed wiring board 10 as shown in FIG. 1, and 250 pieces of BGA 78D are formed with a pitch of about 2 mm on the bottom face side, for instance.

The pitch of the solder bumps corresponds to a pitch of the connecting pads, and when the pitch of the connecting pads is about 60 μm or more, manufacture of solder balls suitable for the pitch becomes possible. When the pitch of the connecting pads is about 200 μm or less, it becomes possible to obtain a printed wiring board adaptable for fine patterning or narrow pitching.

Further, as shown in FIG. 2, an IC mounted printed wiring board 10 is formed by mounting the IC chip 90 through the solder bumps 78U by reflowing, and this IC mounted printed wiring board 10 is mounted on the daughter board 94 through BGA 78D.

Figure 4A:
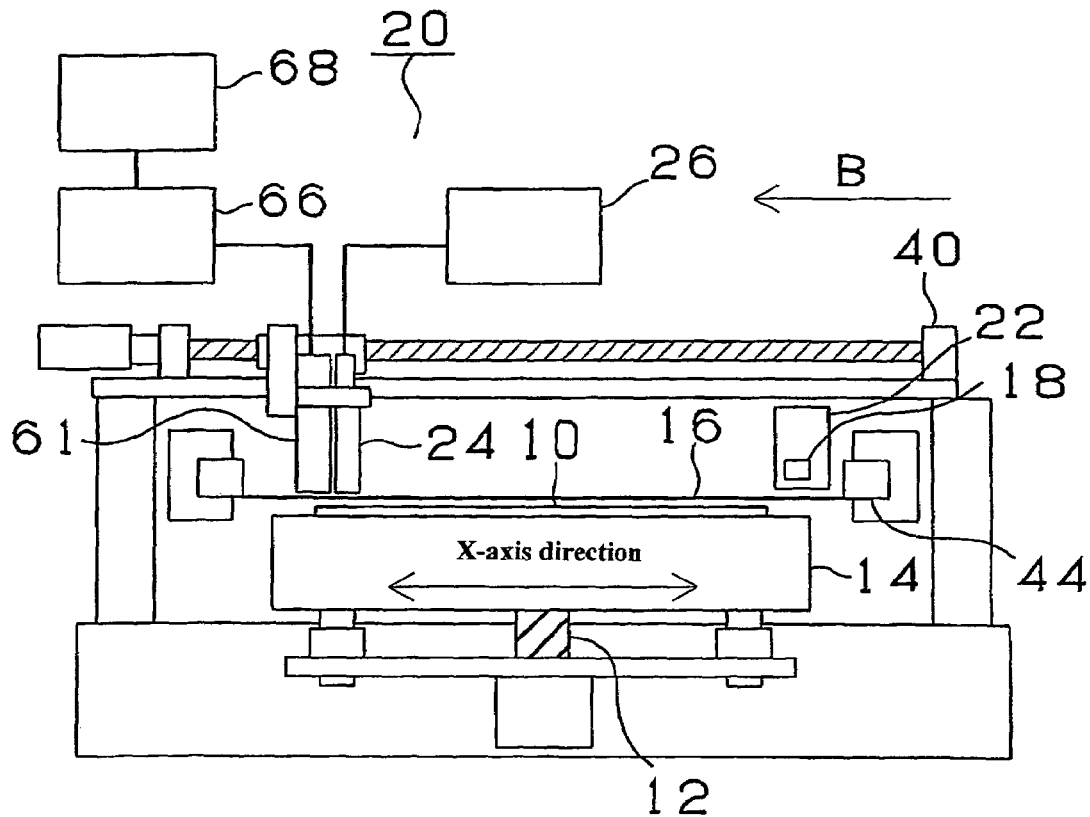
FIGS. 4A to 4B are schematic views showing structure of an apparatus for mounting the solder balls on the wiring board.
Figure 4B:
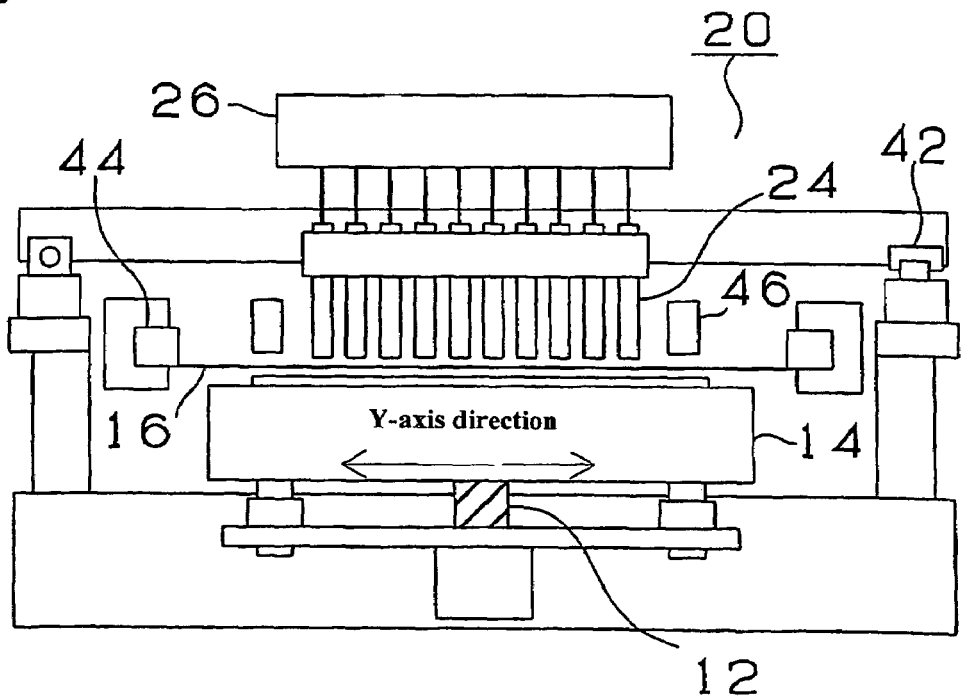

Next, the solder ball loader for mounting the very small solder balls 78s on the corresponding connecting pads of the above-described printed wiring board is explained by referring to FIGS. 4A to 4B.

FIG. 4A is an illustration showing the structure of the solder ball loader, and FIG. 4B is a view taken from an arrow B of the solder ball loader of FIG. 4A.

The solder ball loader 20 comprises an XYθ suction table 14 for positioning and holding the printed wiring board 10, a shaft 12 for moving the XYθ suction table 14 up and down, a ball aligning mask 16 with an opening corresponding to the connecting pad 75 of the printed wiring board, a mounting cylinder (cylinder member) 24 for guiding the solder balls moving on the ball aligning mask 16, a suction box 26 for giving negative pressure to the mounting cylinder 24, a solder ball removing cylinder 61 for recovering excessive solder balls, a suction box 66 for giving negative pressure to the solder ball removing cylinder 61, an adsorbed ball removing and adsorbing device 68 for holding the collected solder balls, a mask clamp 44 for clamping the ball aligning mask 16, an X-axis direction moving shaft 40 for sending the mounting cylinder 24 and the solder ball removing cylinder 61 to the X-axis direction, a moving shaft supporting guide 42 for supporting the X direction moving shaft 40, an alignment camera 46 for taking an image of the multilayer printed wiring board 10, a residue detecting sensor 18 for detecting residual amount of the solder balls under the mounting cylinder 24 and a solder ball supplier 22 for supplying solder balls to the side of the mounting cylinder 24 based on the residue detected by the residue detecting sensor 18.

A plurality of the mounting cylinders 24 and the solder ball removing cylinder 61 are arranged in the Y-axis direction by corresponding to size of the connecting pad regions. Further, the size may correspond to a plurality of the connecting pad areas. Here, the Y-axis direction is expedient and may be aligned in the X-axis direction. The XYθ suction table 14 functions as positioning, adsorption, maintenance and correction of the solder ball mounted printed wiring board 10. The alignment camera 46 detects an alignment mark of the printed wiring board 10 on the XYθ suction table 14 to regulate a position between the printed wiring board and the ball aligning mask 16 based on the detected position. The residue detecting sensor 18 detects the residue of the solder balls by an optical method.

Next, a process for mounting the solder balls by the solder ball loader 20 will be explained by referring to FIGS. 5 to 7.

(1) Position Recognition and Correction of the Printed Wiring Board

Figure 5A:
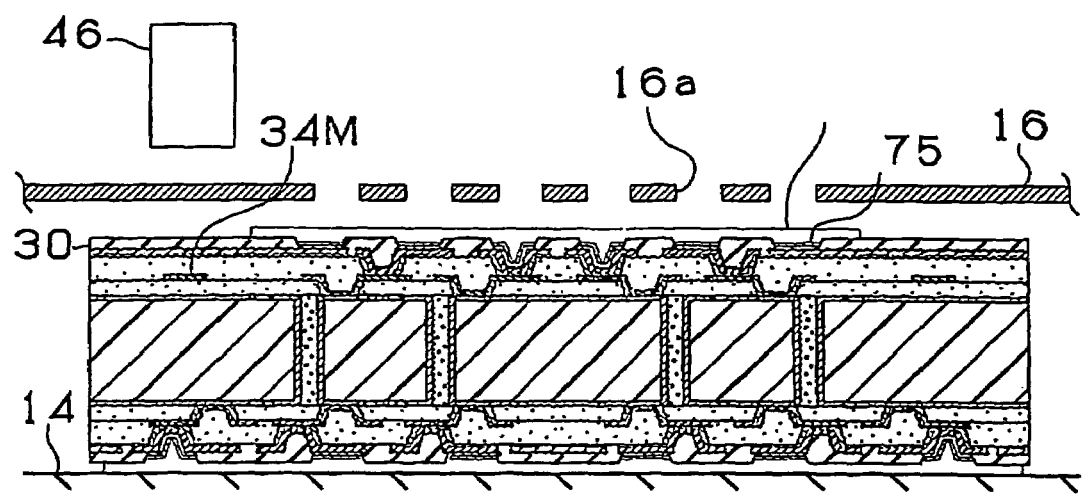
FIG. 5A is a schematic view explaining positioning of the printed wiring board.
Figure 5B:
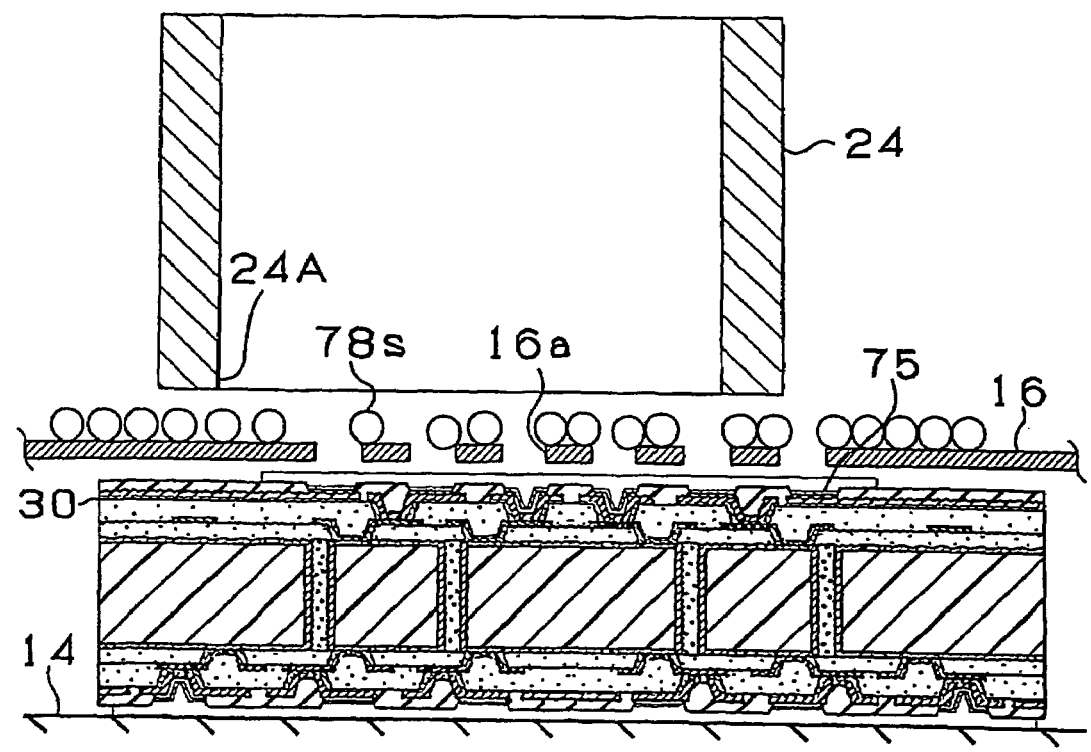
FIG. 5B is a schematic view explaining supply of solder balls to mounting cylinders.

As shown in FIG. 5A, an alignment mark 34M of the printed wiring board 10 is recognized by the alignment camera 46, and the position of the printed wiring board 10 in relation to the ball aligning mask 16 is corrected by the suction table 14. That is, openings 16a of the ball aligning mask 16 are adjusted for corresponding to the connecting pads 75 of the printed wiring board 10 in position, respectively. In addition, here, for illustrating convenience' sake, the printed wiring board 10 for one is only shown, but actually, solder balls are mounted to a printed wiring board of worksheet size for constructing a plurality of wiring boards, and after forming solder bumps, the worksheet size board is cut into respective multilayer printed wiring boards (2) Solder Balls and Supply Thereof As shown in FIG. 5B, the solder balls 78s are quantitatively supplied from a solder ball supplying device 22 to the side of the mounting cylinder 24. Here, as the solder ball, use may be made of any commercial item (for example, made by Hitachi Metals) or, for example, solder balls may be manufactured according to the manufacturing device and method described in Japanese unexamined patent application No. 2001-226705.

After manufactured, such solder balls are placed on a metal plate (e.g. nickel plate of about 25 μm thick) having a square slit (opening) which length and breadth are smaller than a desired diameter of the solder ball by about 1 μm, and the solder balls are rolled thereon and dropped from the slit. Then, small balls having smaller diameters than the desired ones are removed. Thereafter, the solder balls remained on the metal plate are classified by a metal plate having a square slit which length and breadth are larger than the desired diameter of the solder ball by about 1 μm, and solder balls dropped from the slit are collected so as to obtain the solder balls each having a diameter substantially equal to the desired diameter.

The disclosure of Japanese unexamined patent application No. 2001-226705 is incorporated herein by reference in its entirety.

(3) Loading of Solder Balls

Figure 6A:
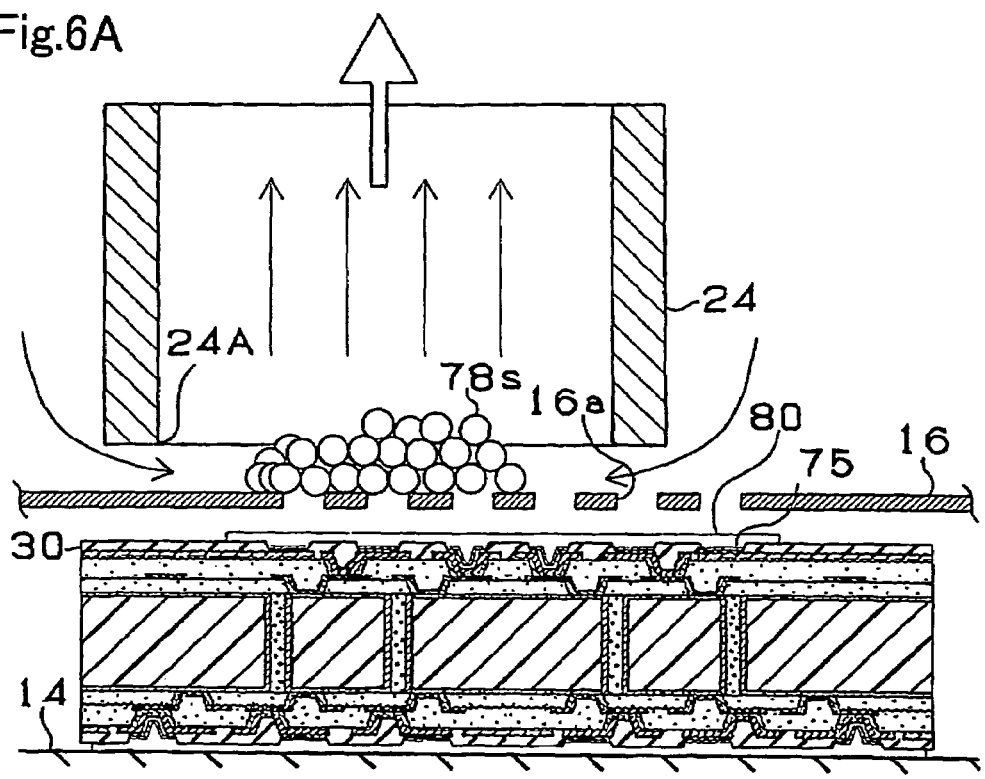
FIG. 6A is a schematic view explaining assembly of solder balls by mounting cylinders.

As shown in FIG. 6A, on the upper part of the ball aligning mask 16 is positioned the mounting cylinder 24 by keeping predetermined clearance (e.g. about 50% to about 300% of a ball diameter), solder balls 78s are assembled on the ball aligning mask 16 right under the opening 24A of the mounting cylinder 24 by adsorbing air from the suction portion 24B at a running speed of about 5 m/sec to about 35 m/sec in a gap between the mounting cylinder and the printed wiring board.

Figure 6B:
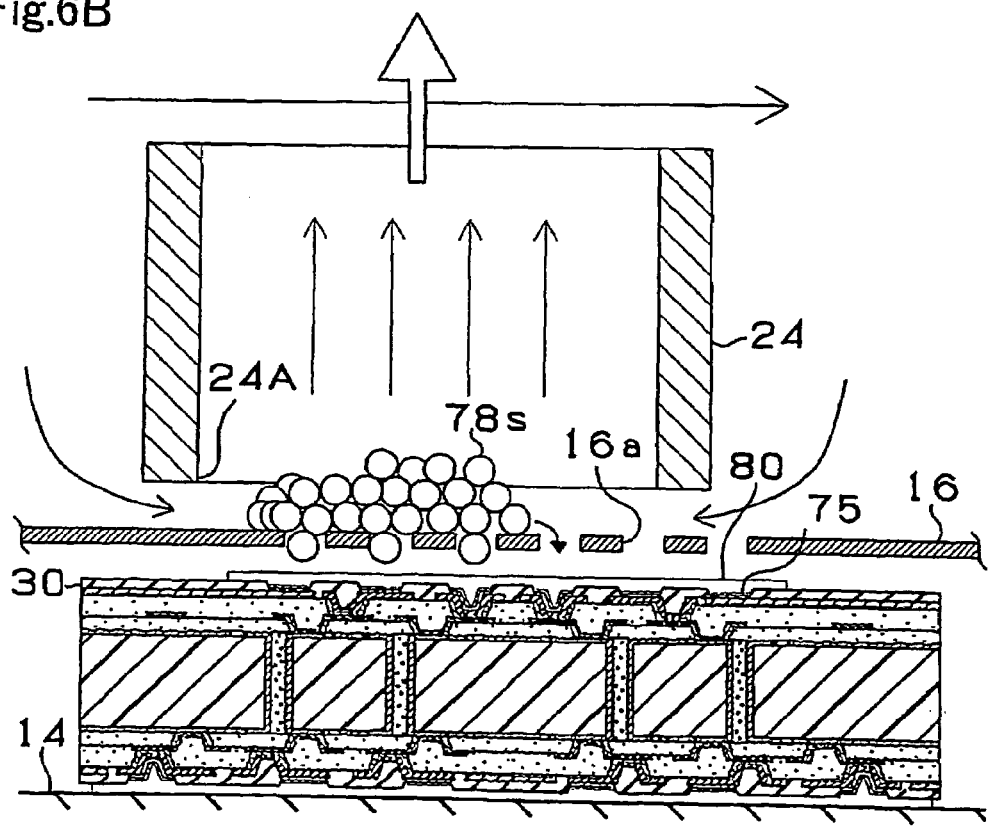
FIG. 6B is a schematic view explaining assembly and guidance of solder balls by the mounting cylinders.
Figure 7A:
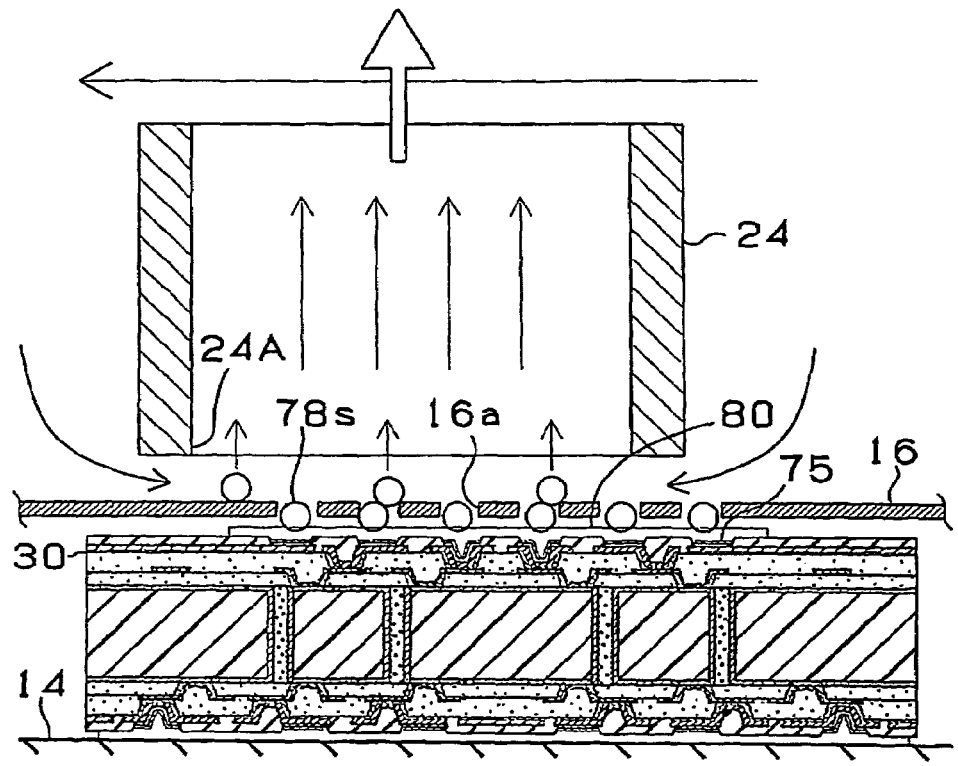
FIG. 7A is a schematic view explaining dropping solder balls to connecting pads.

Thereafter, as shown in FIG. 6B and FIG. 7A, the mounting cylinders 24 aligned along the Y axis of the printed wiring board 10 are sent to the horizontal direction along the X axis by means of the X axis moving shaft 40. Thereby, the solder balls 78s assembled on the ball aligning mask 16 are moved with the movement of the mounting cylinder 24, dropped to the corresponding connecting pads 75 of the printed wiring board 10 through the openings 16a of the ball aligning mask 16 and loaded. Thereby, the solder balls 78s are successively aligned on the whole connecting pads on the side of the printed wiring board 10.

(4) Removal of the Solder Ball

Figure 7B:
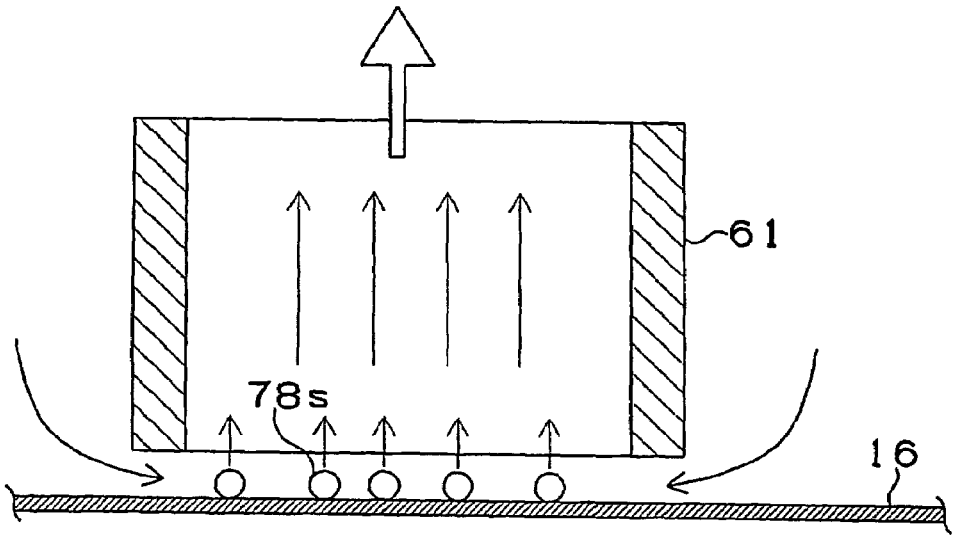
FIG. 7B is a schematic view explaining removal of solder balls by adsorbed-ball removing cylinder.

As shown in FIG. 7B, the excessive solder balls 78s are guided to a place where no opening 16a is provided on the ball aligning mask 16, then adsorbed and removed by the solder ball removing cylinder 61.

(5) Removal of Wiring Board

Then, the printed wiring board 10 is removed from the suction table 14.

According to the solder ball loading method and the solder ball loader as explained in the above, the solder balls 78s are assembled by positioning the mounting cylinder 24 on the upper part of the ball aligning mask 16 and adsorbing air from the suction portion 24B on the top of the mounting cylinder 24, the assembled solder balls 78s are moved on the ball aligning mask 16 by moving the mounting cylinder 24 in the horizontal direction, and the solder balls 78s can be dropped to the respective connecting pads 75 of the printed wiring board 10 through the respective openings 16a of the ball aligning mask 16.

Therefore, fine solder balls 78s can certainly be mounted on the whole of the connecting pads 75 of the printed wiring board 10. Further, since the solder balls 78s can be moved with no contact, the solder balls can be mounted on the connecting pads 75 without injury, which is different from a printing method with the use of a conventional squeeze, and the solder bumps 78U can be made having an equal height.

Therefore, according to the above-described method, there are provided excellent mountability of electronic parts such as ICs and the like, heat cycle test after the mounting and environment resistance test such as high temperature-high humidity test and the like.

Further, without depending on flatness of products, even printed wiring board having much undulated surface can place solder balls on the connecting pads.

Further, as the fine solder balls could certainly be placed on the connecting pads, even in the printed wiring board having such pitch alignment that the connecting pad pitch is about 60 to about 200 μm and the solder resist opening diameter is about 40 to about 150 μm, in the whole of bumps, stable bumps having substantially uniform heights ca be formed.

Further, the solder balls are guided by suction force so as to prevent aggregation and adhesion of solder balls. Further, works (multilayer printed wiring board of work sheet size) having various sizes can be used by adjusting number of the mounting cylinder 24 so as to be applied to many forms and small production.

In the solder ball loader as described above, the mounting cylinders 24 are aligned in the Y-axis direction by corresponding to width of the work (printed wiring board of work sheet size), so that the solder balls can positively be mounted on the whole of connecting pads 75 of the printed wiring boards by simply sending a plurality of mounting cylinders 24 to the vertical direction (X-axis direction) in relation to the row direction.

Further, the solder balls 78s remained on the ball aligning mask 16 can be collected by the solder ball removing cylinder 61, so that there are no problem such that excessive solder ball are remained to cause any trouble and the like.

With the use of the above-described solder ball loading method and device, the solder balls mounted on the connecting pads of the wiring substrate become solder bumps having predetermined height by means of a reflow treatment, IC chips are mounted on the substrate through such solder bumps, and the printed wiring board according to the present invention is manufactured.

EXAMPLE 1

(1) Manufacture of Printed Wiring Board

As starting material, a double sided copper-clad laminate (e.g. "MCL-E-67" made by Hitachi Chemical) is used, and on this substrate are formed a through-hole conductor and a conductor circuit by a known method. Thereafter, insulating layers and conductor circuit layers are alternately laminated by a known method (e.g. described in a book entitled "Build-up multilayer printed wiring board" (Kiyoshi Takagi) published by Nikkan Kogyo Shinbunsha on Jun. 20, 2000, and the content of this book is incorporated herein by reference in its entirety), and in the outermost conductor circuit layer, a group of connecting pads for mounting IC chips consisting a grid-like arrangement having thickness: 20 µm, diameter (conductor pad diameter): 150 µm, pitch: 200 µm, number: 50×40 (pieces) is formed within a connecting pad region of 150 mm².

A dimension of the region for forming these connecting pads was 150 mm². Such connecting pad are formed by a method similar to that described in Japanese unexamined patent application No. 2000-357762. The disclosure of Japanese unexamined patent application No. 2000-357762 is incorporated herein by reference in its entirety.

Further, in case of changing size, pitch, number and arrangement of connecting pad, the pattern (opening diameter, pitch, arrangement, etc.) of a plated resist is changed.

Formation of a solder resist layer is that screen printing is carried out under the following printing condition with the use of a commercial solder resist to form a solder resist layer having a thickness of about 15 to about 25 µm (on the connecting pad) for covering the connecting pad.

(Printing Condition)
Solder resist ink: "RPZ-1" made by Hitachi Kogyo
Ink viscosity: 45±15 Pa·s
Screen print: polyester fiber (130 to 300 mesh)
Speed of squeeze: 100 to 200 mm/sec In this embodiment, there is formed a solder resist layer having a thickness of 25 µm.

Thereafter, a photo mask having a pattern (mask pattern) of openings of the solder resist thereon is exposed to ultraviolet ray of 100 to 1000 mJ under the state of adhering to the solder resist layer, and developed with a sodium carbonate solution (Na₂CO₃) of 10 g/L, thereby forming the openings of about 120 µm in diameter on the corresponding connecting pads.

(2) Mounting of Solder Balls

After applying commercial rosin-based flux to the surface (IC mounting face) of the printed wiring board manufactured in the above (1), solder balls are placed on the suction table of a solder ball loader, alignment marks of the printed wiring board and the ball aligning mask are recognized by using a CCD camera, and alignment of the printed wiring board and the ball aligning mask is carried out.

Here, as the ball aligning mask, use is made of a metal mask made of Ni having openings of about 175 µm in diameter at the position corresponding to the connecting pads of the printed wiring board. Besides, it is possible to use ball aligning masks made of SUS and polyimide.

Further, an opening diameter formed in the ball aligning mask is preferably about 1.1 to about 1.5 times the ball diameter used, and a thickness of the ball aligning mask is preferably about ½ to about ¾ of the diameter of the solder ball used.

Next, the mounting cylinder of about 200 mm in height with a size (about 1.2 to about 3 times to the connecting pad region) corresponding to the connecting pad region is positioned on the metal mask (ball aligning mask) by keeping clearance of about 2 times the solder ball diameter, and solder balls (made by Hitachi Metals) of about 145 µm in diameter consisting of Sn/Pb solder (Sn/Pb=63:37) are mounted on the peripheral vicinity of the mask.

In this example, Sn/Pb is used for the solder ball, use may be made of Pb free solder consisting of at least one metal and Sn selected from the group of Ag, Co, In, Bi, Zn and the like. And, air is adsorbed from the top of the mounting cylinder, and the air speed in a gap between the mounting cylinder and the printed wiring board is regulated to about 5 to about 35 m/sec for assembling the solder balls within the mounting cylinder.

Thereafter, the mounting cylinder is moved at about 10 to about 40 mm/sec to roll the solder balls, and the solder balls are dropped from the respective openings of the ball aligning mask and mounted on the corresponding connection pads.

(3) Formation of Solder Bump

Further, after removing excessive solder balls on the ball aligning mask, the solder ball aligning mask and the printed wiring board are separately taken out of the solder ball loader, and finally, the printed wiring board is put in the reflow furnace set at 230° C. to form a solder bump.

After forming the solder bump, a height of the solder bump protruded from the solder resist surface is measured by a laser microscope ("VX-8500" made by KEYENCE or "WYKO NT-2000" made by Veeco).

In the above measurement, measurement points are four corners and a center of a rectangle, i.e. four solder bumps located at the four corners of a rectangle defined by the connecting pad group and a solder bump substantially positioned at the center of the rectangle are measured, that is to say, five solder bumps in total are measured at this time. As a result, the minimum value of the solder bump height is 66 µm and the maximum value thereof is 70 µm.

(4) Mounting of IC chip

After measuring the height of each solder bump, an IC chip is mounted through the solder bumps, and the IC chip mounted printed wiring board is manufactured by filling a commercial under fill resin 100 between the IC chip and the solder resist.

EXAMPLE 2

Except that the printing condition (mesh of the screen and printing speed) of the solder resist is regulated, film thickness of the solder resist is made 15 µm and the solder ball having a diameter of 140 µm is mounted with the use of the ball aligning mask having an opening diameter of 160 µm, a printed wiring boards is manufactured in the same manner as in Example 1. As a result, the minimum value of the solder bump height becomes 63 µm and the maximum value thereof becomes 68 µm.

EXAMPLE 3

Except that the printing condition (mesh of screen and printing speed) of the solder resist is regulated, film thickness of the solder resist is made 15 μm and the solder ball having a diameter of 135 μm is mounted with the use of the ball aligning mask having an opening diameter of 155 μm, a printed wiring board is manufactured in the same manner as in Example 1. As a result, the minimum value of the solder bump height becomes 65 μm and the maximum value thereof becomes 70 μm.

EXAMPLE 4

Except that the printing condition (mesh of screen and printing speed) of the solder resist is regulated, film thickness of the solder resist is made 10 μm and the solder ball having a diameter of 130 μm is mounted with the use of the ball aligning mask having an opening diameter of 150 μm, a printed wiring board is manufactured in the same manner as in Example 1. As a result, the minimum value of the solder bump height becomes 66 μm and the maximum value thereof becomes 68 μm.

EXAMPLE 5

Except that the pattern of the plating resist is changed to change connecting pad diameter: 120 μm and pitch: 150 μm, the mask pattern of a photo mask in case of forming a solder resist opening is changed to change the solder resist opening diameter to 90 μm, the printing condition (mesh of screen and printing speed) of the solder resist is regulated, film thickness of the solder resist is made 10 μm and the solder ball having a diameter of 90 μm is mounted with the use of the ball aligning mask having an opening diameter of 110 μm, a printed wiring board is manufactured in the same manner as in Example 1. As a result, the minimum value of the solder bump height becomes 46 μm and the maximum value thereof becomes 49 μm.

EXAMPLE 6

Except that the printing condition (mesh of screen and printing speed) of the solder resist is regulated, film thickness of the solder resist is made 15 μm, and the solder ball having a diameter of 95 μm is mounted with the use of the ball aligning mask having an opening diameter of 115 μm, a printed wiring board is manufactured in the same manner as in Example 5. As a result, the minimum value of the solder bump height becomes 45 μm and the maximum value thereof becomes 49 μm.

EXAMPLE 7

Except that the printing condition (mesh of screen and printing speed) of the solder resist is regulated, film thickness of the solder resist is made 20 μm and the solder ball having a diameter of 100 μm is mounted with the use of the ball aligning mask having an opening diameter of 120 μm, a printed wiring board is manufactured in the same manner as in Example 5. As a result, the minimum value of the solder bump height becomes 47 μm and the maximum value thereof becomes 49 μm.

EXAMPLE 8

Except that the printing condition (mesh of screen and printing speed) of the solder resist is regulated, film thickness of the solder resist is made 25 μm and the solder ball having a diameter of 105 μm is mounted with the use of the ball aligning mask having an opening diameter of 130 μm, a printed wiring board is manufactured in the same manner as in Example 5. As a result, the minimum value of the solder bump height becomes 47 μm and the maximum value thereof becomes 48 μm.

EXAMPLE 9

Except that the pattern of the plating resist is changed to change connecting pad diameter: 80 μm and pitch: 100 μm, the mask pattern of the photo mask in case of forming a solder resist opening is changed to change the solder resist opening diameter to 60 μm, the printing condition (mesh of screen and printing speed) of the solder resist is regulated, film thickness of the solder resist is made 10 μm and the solder ball having a diameter of 50 μm is mounted with the use of the ball aligning mask having an opening diameter of 60 μm, a printed wiring board is manufactured in the same manner as in Example 1. As a result, the minimum value of the solder bump height becomes 31 μm and the maximum value thereof becomes 34 μm.

EXAMPLE 10

Except that the printing condition (mesh of screen and printing speed) of the solder resist is regulated, film thickness of the solder resist is made 15 μm and the solder ball having a diameter of 55 μm is mounted with the use of the ball aligning mask having an opening diameter of 70 μm, a printed wiring board is manufactured in the same manner as in Example 9. As a result, the minimum value of the solder bump height becomes 33 μm and the maximum value thereof becomes 34 μm.

EXAMPLE 11

Except that the printing condition (mesh of screen and printing speed) of the solder resist is regulated, film thickness of the solder resist is made 20 μm and the solder ball having a diameter of 60 μm is mounted with the use of the ball aligning mask having an opening diameter of 70 μm, a printed wiring board is manufactured in the same manner as in Example 9. As a result, the minimum value of the solder bump height becomes 33 μm and the maximum value thereof becomes 35 μm.

EXAMPLE 12

Except that the printing condition (mesh of screen and printing speed) of the solder resist is regulated, film thickness of the solder resist is made 25 μm and the solder ball having a diameter of 65 μm is mounted with the use of the ball aligning mask having an opening diameter of 80 μm, a printed wiring board is manufactured in the same manner as in Example 9. As a result, the minimum value of the solder bump height becomes 32 μm and the maximum value thereof becomes 34 μm.

EXAMPLE 13

Except that the solder ball having a diameter of 160 μm is mounted with the use of the ball aligning mask having an opening diameter of 190 μm, a printed wiring board is manufactured in the same manner as in Example 1. As a result, the minimum value of the solder bump height becomes 84 μm and the maximum value thereof becomes 87 μm.

EXAMPLE 14

Except that the solder ball having a diameter of 155 μm is mounted with the use of the ball aligning mask having an opening diameter of 180 μm, a printed wiring board is manufactured in the same manner as in Example 2. As a result, the minimum value of the solder bump height becomes 83 μm and the maximum value thereof becomes 86 μm.

EXAMPLE 15

Except that the solder ball having a diameter of 150 μm is mounted with the use of the ball aligning mask having an opening diameter of 180 μm, a printed wiring board is manufactured in the same manner as in Example 3. As a result, the minimum value of the solder bump height becomes 83 μm and the minimum value thereof becomes 87 μm.

EXAMPLE 16

Except that the solder ball having a diameter of 145 μm is mounted with the use of the ball aligning mask having an opening diameter of 170 μm, a printed wiring board is manufactured in the same manner as in Example 4. As a result, the minimum value of the solder bump height becomes 84 μm and the maximum value thereof becomes 86 μm.

EXAMPLE 17

Except that the solder ball having a diameter of 100 μm is mounted with the use of the ball aligning mask having an opening diameter of 120 μm, a printed wiring board is manufactured in the same manner as in Example 5. As a result, the minimum value of the solder bump height becomes 63 μm and the maximum value thereof becomes 66 μm.

EXAMPLE 18

Except that the solder ball having a diameter of 105 μm is mounted with the use of the ball aligning mask having an opening diameter of 130 μm, a printed wiring board is manufactured in the same manner as in Example 6. As a result, the minimum value of the solder bump height becomes 63 μm and the maximum value thereof becomes 66 μm.

EXAMPLE 19

Except that the solder ball having a diameter of 110 μm is mounted with the use of the ball aligning mask having an opening diameter of 140 μm, a printed wiring board is manufactured in the same manner as in Example 7. As a result, the minimum value of the solder bump height becomes 61 μm and the maximum value thereof becomes 67 μm.

EXAMPLE 20

Except that the solder ball having a diameter of 115 μm is mounted with the use of the ball aligning mask having an opening diameter of 140 μm, a printed wiring board is manufactured in the same manner as in Example 8. As a result, the minimum value of the solder bump height becomes 61 μm and the maximum value thereof becomes 65 μm.

EXAMPLE 21

Except that the solder ball having a diameter of 60 μm is mounted with the use of the ball aligning mask having an opening diameter of 80 μm, a printed wiring board is manufactured in the same manner as in Example 9. As a result, the minimum value of the solder bump height becomes 40 μm and the maximum value thereof becomes 43 μm.

EXAMPLE 22

Except that the solder ball having a diameter of 65 μm is mounted with the use of the ball aligning mask having an opening diameter of 85 μm, a printed wiring board is manufactured in the same manner as in Example 10. As a result, the minimum value of the solder bump height becomes 40 μm and the maximum value thereof becomes 43 μm.

EXAMPLE 23

Except that the solder ball having a diameter of 70 μm is mounted with the use of the ball aligning mask having an opening diameter of 90 μm, a printed wiring board is manufactured in the same manner as in Example 11. As a result, the minimum value of the solder bump height becomes 41 μm and the maximum value thereof becomes 44 μm.

EXAMPLE 24

Except that the solder ball having a diameter of 75 μm is mounted with the use of the ball aligning mask having an opening diameter of 95 μm, a printed wiring boards is manufactured in the same manner as in Example 12. As a result, the minimum value of the solder bump height becomes 42 μm and the maximum value thereof becomes 42 μm.

EXAMPLE 25

Except that the solder ball having a diameter of 190 μm is mounted with the use of the ball aligning mask having an opening diameter of 230 μm, a printed wiring board is manufactured in the same manner as in Example 1. As a result, the minimum value of the solder bump height becomes 120 μm and the maximum value thereof becomes 120 μm.

EXAMPLE 26

Except that the solder ball having a diameter of 185 μm is mounted with the use of the ball aligning mask having an opening diameter of 230 μm, a printed wiring board is manufactured in the same manner as in Example 2. As a result, the minimum value of the solder bump height becomes 121 μm and the maximum value thereof becomes 122 μm.

EXAMPLE 27

Except that the solder ball having a diameter of 180 μm is mounted with the use of the ball aligning mask having an opening diameter of 220 μm, a printed wiring boards is manufactured in the same manner as in Example 3. As a result, the minimum value of the solder bump height becomes 122 μm and the maximum value thereof becomes 126 μm.

EXAMPLE 28

Except that the solder ball having a diameter of 175 μm is mounted with the use of the ball aligning mask having an opening diameter of 200 μm, a printed wiring board is manufactured in the same manner as in Example 4. As a result, the minimum value of the solder bump height becomes 122 μm and the maximum value thereof becomes 123 μm.

EXAMPLE 29

Except that the solder ball having a diameter of 125 μm is mounted with the use of the ball aligning mask having an opening diameter of 150 μm, a printed wiring board is manufactured in the same manner as in Example 5. As a result, the minimum value of the solder bump height becomes 92 μm and the maximum value thereof becomes 94 μm.

EXAMPLE 30

Except that the solder ball having a diameter of 130 μm is mounted with the use of the ball aligning mask having an opening diameter of 150 μm, a printed wiring board is manufactured in the same manner as in Example 6. As a result, the minimum value of the solder bump height becomes 90 μm and the maximum value thereof becomes 93 μm.

EXAMPLE 31

Except that the solder ball having a diameter of 135 μm is mounted with the use of the ball aligning mask having an opening diameter of 160 μm, a printed wiring board is manufactured in the same manner as in Example 7. As a result, the minimum value of the solder bump height becomes 91 μm and the maximum value thereof becomes 93 μm.

EXAMPLE 32

Except that the solder ball having a diameter of 140 μm is mounted with the use of the ball aligning mask having an opening diameter of 170 μm, a printed wiring board is manufactured in the same manner as in Example 8. As a result, the minimum value of the solder bump height becomes 90 μm and the maximum value thereof becomes 91 μm.

EXAMPLE 33

Except that the solder ball having a diameter of 75 μm is mounted with the use of the ball aligning mask having an opening diameter of 90 μm, a printed wiring board is manufactured in the same manner as in Example 9. As a result, the minimum value of the solder bump height becomes 61 μm and the maximum value thereof becomes 63 μm.

EXAMPLE 34

Except that the solder ball having a diameter of 80 μm is mounted with the use of the ball aligning mask having an opening diameter of 100 μm, a printed wiring board is manufactured in the same manner as in Example 10. As a result, the minimum value of the solder bump height becomes 60 μm and the maximum value thereof becomes 63 μm.

EXAMPLE 35

Except that the solder ball having a diameter of 85 μm is mounted with the use of the ball aligning mask having an opening diameter of 110 μm, a printed wiring board is manufactured in the same manner as in Example 11. As a result, the minimum value of the solder bump height becomes 62 μm and the maximum value thereof becomes 63 μm.

EXAMPLE 36

Except that the solder ball having a diameter of 90 μm is mounted with the use of the ball aligning mask having an opening diameter of 120 μm, a printed wiring board is manufactured in the same manner as in Example 12. As a result, the minimum value of the solder bump height becomes 60 μm and the maximum value thereof becomes 61 μm.

Comparative Example 1

Except that the solder ball having a diameter of 125 μm is mounted with the use of the ball aligning mask having an opening diameter of 150 μm, a printed wiring board is manufactured in the same manner as in Example 1. As a result, the minimum value of the solder bump height becomes 48 μm and the maximum value thereof becomes 50 μm.

Comparative Example 2

Except that the solder ball having a diameter of 120 μm is mounted with the use of the ball aligning mask having an opening diameter of 150 μm, a printed wiring board is manufactured in the same manner as in Example 2. As a result, the minimum value of the solder bump height becomes 46 μm and the maximum value thereof becomes 50 μm.

Comparative Example 3

Except that the solder ball having a diameter of 115 μm is mounted with the use of the ball aligning mask having an opening diameter of 130 μm, a printed wiring board is manufactured in the same manner as in Example 3. As a result, the minimum value of the solder bump height becomes 45 μm and the maximum value thereof becomes 47 μm.

Comparative Example 4

Except that the solder ball having a diameter of 110 μm is mounted with the use of the ball aligning mask having an opening diameter of 130 μm, a printed wiring board is manufactured in the same manner as in Example 4. As a result, the minimum value of the solder bump height becomes 48 μm and the maximum value thereof becomes 50 μm.

Comparative Example 5

Except that the solder ball having a diameter of 80 μm is mounted with the use of the ball aligning mask having an opening diameter of 100 μm, a printed wiring board is manufactured in the same manner as in Example 5. As a result, the minimum value of the solder bump height becomes 35 μm and the maximum value thereof becomes 36 μm.

Comparative Example 6

Except that the solder ball having a diameter of 85 μm is mounted with the use of the ball aligning mask having an opening diameter of 110 μm, a printed wiring board is manufactured in the same manner as in Example 6. As a result, the minimum value of the solder bump height becomes 33 μm and the maximum value thereof becomes 35 μm.

Comparative Example 7

Except that the solder ball having a diameter of 90 μm is mounted with the use of the ball aligning mask having an opening diameter of 115 μm, a printed wiring board is manufactured in the same manner as in Example 7. As a result, the minimum value of the solder bump height becomes 36 μm and the maximum value thereof becomes 38 μm.

Comparative Example 8

Except that the solder ball having a diameter of 95 μm is mounted with the use of the ball aligning mask having an opening diameter of 120 μm, a printed wiring board is manufactured in the same manner as in Example 8. As a result, the minimum value of the solder bump height becomes 36 μm and the maximum value thereof becomes 39 μm.

Comparative Example 9

Except that the solder ball having a diameter of 40 μm is mounted with the use of the ball aligning mask having an opening diameter of 55 μm, a printed wiring board is manufactured in the same manner as in Example 9. As a result, the minimum value of the solder bump height becomes 22 μm and the maximum value thereof becomes 24 μm.

Comparative Example 10

Except that the solder ball having a diameter of 45 μm is mounted with the use of the ball aligning mask having an opening diameter of 60 μm, a printed wiring board is manufactured in the same manner as in Example 10. As a result, the minimum value of the solder bump height becomes 21 μm and the maximum value thereof becomes 23 μm.

Comparative Example 11

Except that the solder ball having a diameter of 50 μm is mounted with the use of the ball aligning mask having an opening diameter of 70 μm, a printed wiring board is manufactured in the same manner as in Example 11. As a result, the minimum value of the solder bump height becomes 20 μm and the maximum value thereof becomes 22 μm.

Comparative Example 12

Except that the solder ball having a diameter of 55 μm is mounted with the use of the ball aligning mask having an opening diameter of 80 μm, a printed wiring board is manufactured in the same manner as in Example 12. As a result, the minimum value of the solder bumper height becomes 24 μm and the maximum value thereof becomes 26 μm.

Comparative Example 13

Except that the solder ball having a diameter of 220 μm is mounted with the use of the ball aligning mask having an opening diameter of 260 μm, a printed wiring board is manufactured in the same manner as in Example 1. As a result, the minimum value of the solder bump height becomes 155 μm and the maximum value thereof becomes 165 μm.

Comparative Example 14

Except that the solder ball having a diameter of 215 μm is mounted with the use of the ball aligning mask having an opening diameter of 260 μm, a printed wiring board is manufactured in the same manner as in Example 2. As a result, the minimum value of the solder bump height becomes 100 μm and the maximum value thereof becomes 180 μm.

Comparative Example 15

Except that the solder ball having a diameter of 210 μm is mounted with the use of the ball aligning mask having an opening diameter of 250 μm, a printed wiring board is manufactured in the same manner as in Example 3. As a result, the minimum value of the solder bump height becomes 150 μm and the maximum value thereof becomes 160 μm.

Comparative Example 16

Except that the solder ball having a diameter of 205 μm is mounted with the use of the ball aligning mask having an opening diameter of 240 μm, a printed wiring board is manufactured in the same manner as in Example 4. As a result, the minimum value of the solder bump height becomes 112 μm and the maximum value thereof becomes 158 μm.

Comparative Example 17

Except that the solder ball having a diameter of 155 μm is mounted with the use of the ball aligning mask having an opening diameter of 180 μm, a printed wiring board is manufactured in the same manner as in Example 5. As a result, the minimum value of the solder bump height becomes 88 μm and the maximum value thereof becomes 120 μm.

Comparative Example 18

Except that the solder ball having a diameter of 160 μm is mounted with the use of the ball aligning mask having an opening diameter of 180 μm, a printed wiring board is manufactured in the same manner as in Example 6. As a result, the minimum value of the solder bump height becomes 120 μm and the maximum value thereof becomes 180 μm.

Comparative Example 19

Except that the solder ball having a diameter of 165 μm is mounted with the use of the ball aligning mask having an opening diameter of 190 μm, a printed wiring board is manufactured in the same manner as in Example 7. As a result, the minimum value of the solder bump height becomes 120 μm and the maximum value thereof becomes 128 μm.

Comparative Example 20

Except that the solder ball having a diameter of 170 μm is mounted with the use of the ball aligning mask having an opening diameter of 200 μm, a printed wiring board is manufactured in the same manner as in Example 8. As a result, the minimum value of the solder bump height becomes 75 μm and the maximum value thereof becomes 160 μm.

Comparative Example 21

Except that the solder ball having a diameter of 105 μm is mounted with the use of the ball aligning mask having an opening diameter of 140 μm, a printed wiring board is manufactured in the same manner as in Example 9. As a result, the minimum value of the solder bump height becomes 80 μm and the maximum value thereof becomes 88 μm.

Comparative Example 22

Except that the solder ball having a diameter of 110 μm is mounted with the use of the ball aligning mask having an opening diameter of 140 μm, a printed wiring board is manufactured in the same manner as in Example 10. As a result, the minimum value of the solder bump height becomes 40 μm and the maximum value thereof becomes 90 μm.

Comparative Example 23

Except that the solder ball having a diameter of 115 μm is mounted with the use of the ball aligning mask having an opening diameter of 140 μm, a printed wiring board is manufactured in the same manner as in Example 11. As a result, the minimum value of the solder bump height becomes 80 μm and the maximum value thereof becomes 85 μm.

Comparative Example 24

Except that the solder ball having a diameter of 120 μm is mounted with the use of the ball aligning mask having an opening diameter of 150 μm, a printed wiring board is manufactured in the same manner as in Example 12. As a result, the minimum value of the solder bump height becomes 75 μm and the maximum value thereof becomes 90 μm.

Here, as to the IC mounted printed wiring boards manufactured according to Examples 1 to 36 and Comparative Examples 1 to 24, a test for evaluating heat cycle resistance is conducted as follows.

(Heat Cycle Resistance)

First, there is measured electric resistance (between a pair of connecting pads exposed to the surface opposite to the IC chip mounted surface of the IC mounted printed wiring board and electrically connected to the IC chip) of a specific circuit through IC chips, and its value is determined as an initial value.

Thereafter, a heat cycle test under the condition of −55° C. (5 minutes)⇆125° C. (5 minutes) as one cycle is repeated 1000 times to those IC chip mounting printed wiring boards. Electric resistances after 500 cycles and 1000 cycles are measured, respectively, and a rate of change (100×(measured value−initial value)/initial value (%)) with the initial value is obtained. The case within ±10 is evaluated as "good (O)", and others are evaluated as "no good (x)". This test result is shown in Table 1 and Table 2.

TABLE 1

| Examples | Diameter of Connecting Pad (μm) | Pitch of Connecting Pad (μm) | Thickness of Solder Resist Layer (μm) | Opening Diameter of Solder Resist Layer (μm) | Diameter of Solder Ball (μm) | Opening Diameter of Mask (μm) | Height of Bamp (minimum) (μm) | Height of Bamp (Maximum) (μm) | Height of Bamp/Opening Diameter of SR | Heat Cycle Test 500 cycles | Heat Cycle Test 1000 cycles |
|---|---|---|---|---|---|---|---|---|---|---|---|
| Example 1 | 150 | 200 | 25 | 120 | 145 | 175 | 66 | 70 | 0.55 | O | O |
| Example 2 | 150 | 200 | 20 | 120 | 140 | 160 | 63 | 68 | 0.53 | O | O |
| Example 3 | 150 | 200 | 15 | 120 | 135 | 155 | 65 | 70 | 0.54 | O | O |
| Example 4 | 150 | 200 | 10 | 120 | 130 | 150 | 66 | 68 | 0.55 | O | O |
| Example 5 | 120 | 150 | 10 | 90 | 90 | 110 | 46 | 49 | 0.51 | O | O |
| Example 6 | 120 | 150 | 15 | 90 | 95 | 115 | 45 | 49 | 0.50 | O | O |
| Example 7 | 120 | 150 | 20 | 90 | 100 | 120 | 47 | 49 | 0.52 | O | O |
| Example 8 | 120 | 150 | 25 | 90 | 105 | 130 | 47 | 49 | 0.52 | O | O |
| Example 9 | 80 | 100 | 10 | 60 | 50 | 60 | 31 | 34 | 0.52 | O | O |
| Example 10 | 80 | 100 | 15 | 60 | 55 | 70 | 33 | 34 | 0.55 | O | O |
| Example 11 | 80 | 100 | 20 | 60 | 60 | 70 | 33 | 35 | 0.55 | O | O |
| Example 12 | 80 | 100 | 25 | 60 | 65 | 80 | 32 | 34 | 0.53 | O | O |
| Example 13 | 150 | 200 | 25 | 120 | 160 | 190 | 84 | 87 | 0.70 | O | O |
| Example 14 | 150 | 200 | 20 | 120 | 155 | 180 | 83 | 86 | 0.69 | O | O |
| Example 15 | 150 | 200 | 15 | 120 | 150 | 180 | 83 | 87 | 0.69 | O | O |
| Example 16 | 150 | 200 | 10 | 120 | 145 | 170 | 84 | 86 | 0.70 | O | O |
| Example 17 | 120 | 150 | 10 | 90 | 100 | 120 | 63 | 66 | 0.70 | O | O |
| Example 18 | 120 | 150 | 15 | 90 | 105 | 130 | 63 | 67 | 0.70 | O | O |
| Example 19 | 120 | 150 | 20 | 90 | 110 | 140 | 61 | 67 | 0.68 | O | O |
| Example 20 | 120 | 150 | 25 | 90 | 115 | 140 | 61 | 65 | 0.68 | O | O |
| Example 21 | 80 | 100 | 10 | 60 | 60 | 80 | 40 | 43 | 0.67 | O | O |
| Example 22 | 80 | 100 | 15 | 60 | 65 | 85 | 40 | 43 | 0.67 | O | O |
| Example 23 | 80 | 100 | 20 | 60 | 70 | 90 | 41 | 44 | 0.68 | O | O |
| Example 24 | 80 | 100 | 25 | 60 | 75 | 95 | 42 | 42 | 0.70 | O | O |
| Example 25 | 150 | 200 | 25 | 120 | 190 | 230 | 120 | 120 | 1.00 | O | O |
| Example 26 | 150 | 200 | 20 | 120 | 185 | 230 | 121 | 122 | 1.01 | O | O |
| Example 27 | 150 | 200 | 15 | 120 | 180 | 220 | 122 | 126 | 1.02 | O | O |
| Example 28 | 150 | 200 | 10 | 120 | 175 | 200 | 122 | 123 | 1.02 | O | O |
| Example 29 | 120 | 150 | 10 | 90 | 125 | 150 | 92 | 94 | 1.02 | O | O |
| Example 30 | 120 | 150 | 15 | 90 | 130 | 150 | 90 | 93 | 1.00 | O | O |
| Example 31 | 120 | 150 | 20 | 90 | 135 | 160 | 91 | 93 | 1.01 | O | O |
| Example 32 | 120 | 150 | 25 | 90 | 140 | 170 | 90 | 91 | 1.00 | O | O |
| Example 33 | 80 | 100 | 10 | 60 | 75 | 90 | 61 | 63 | 1.02 | O | O |
| Example 34 | 80 | 100 | 15 | 60 | 80 | 100 | 60 | 63 | 1.00 | O | O |
| Example 35 | 80 | 100 | 20 | 60 | 85 | 110 | 62 | 63 | 1.03 | O | O |
| Example 36 | 80 | 100 | 25 | 60 | 90 | 120 | 60 | 61 | 1.00 | O | O |

TABLE 2

| Examples | Diameter of Connecting Pad (μm) | Pitch of Connecting Pad (μm) | Thickness of Solder Resist Layer (μm) | Opening Diameter of Solder Resist Layer (μm) | Diamter of Solder Ball (μm) | Opening Diameter of Solder Resist Layer (μm) | Height of Bamp (minimum) (μm) | height of Bamp (Maximum) (μm) | Height of Bamp/Opening Diameter of SR | Heat Cycle Test 500 cycles | Heat Cycle Test 1000 cycles |
|---|---|---|---|---|---|---|---|---|---|---|---|
| Example 1 | 150 | 200 | 25 | 120 | 125 | 150 | 48 | 50 | 0.40 | ○ | X |
| Example 2 | 150 | 200 | 20 | 120 | 120 | 150 | 46 | 50 | 0.38 | ○ | X |
| Example 3 | 150 | 200 | 15 | 120 | 115 | 130 | 45 | 47 | 0.38 | ○ | X |
| Example 4 | 150 | 200 | 10 | 120 | 110 | 130 | 48 | 50 | 0.40 | ○ | X |
| Example 5 | 120 | 150 | 10 | 90 | 80 | 100 | 35 | 36 | 0.39 | ○ | X |
| Example 6 | 120 | 150 | 15 | 90 | 85 | 110 | 33 | 35 | 0.37 | ○ | X |
| Example 7 | 120 | 150 | 20 | 90 | 90 | 115 | 36 | 38 | 0.40 | ○ | X |
| Example 8 | 120 | 150 | 25 | 90 | 95 | 120 | 36 | 39 | 0.40 | ○ | X |
| Example 9 | 80 | 100 | 10 | 60 | 40 | 55 | 22 | 24 | 0.37 | ○ | X |
| Example 10 | 80 | 100 | 15 | 60 | 45 | 60 | 21 | 23 | 0.35 | ○ | X |
| Example 11 | 80 | 100 | 20 | 60 | 50 | 70 | 20 | 22 | 0.33 | ○ | X |
| Example 12 | 80 | 100 | 25 | 60 | 55 | 80 | 24 | 26 | 0.40 | ○ | X |
| Example 13 | 150 | 200 | 25 | 120 | 220 | 260 | 155 | 165 | 1.29 | X | X |
| Example 14 | 150 | 200 | 20 | 120 | 215 | 260 | 100 | 180 | 0.83 | X | X |
| Example 15 | 150 | 200 | 15 | 120 | 210 | 250 | 150 | 160 | 1.25 | X | X |
| Example 16 | 150 | 200 | 10 | 120 | 205 | 240 | 112 | 158 | 0.93 | X | X |
| Example 17 | 120 | 150 | 10 | 90 | 155 | 180 | 88 | 120 | 0.98 | X | X |
| Example 18 | 120 | 150 | 15 | 90 | 160 | 180 | 120 | 180 | 1.33 | X | X |
| Example 19 | 120 | 150 | 20 | 90 | 165 | 190 | 115 | 120 | 1.28 | X | X |
| Example 20 | 120 | 150 | 25 | 90 | 170 | 200 | 76 | 160 | 0.84 | X | X |
| Example 21 | 80 | 100 | 10 | 60 | 105 | 140 | 80 | 88 | 1.33 | X | X |
| Example 22 | 80 | 100 | 15 | 60 | 110 | 140 | 40 | 90 | 0.67 | X | X |
| Example 23 | 80 | 100 | 20 | 60 | 115 | 140 | 80 | 85 | 1.33 | X | X |
| Example 24 | 80 | 100 | 25 | 60 | 120 | 150 | 75 | 90 | 1.25 | X | X |

Next, as to Examples 2, 7, 11, 14, 19, 23, 26, 31 and 35 among Examples 1 to 36, after forming a solder resist layer, printed wiring boards made by applying the following flattening treatment to the solder resist layer surface are manufactured, and these are denoted as Examples 37 to 45.

EXAMPLE 37

Except that the following flattening treatment id applied to the solder resist layer surface after forming the resist layer, a printed wiring board is manufactured in the same manner as in Example 2.

(Flattening Treatment)

First, on the solder resist layer surface, a connecting pad region for mounting IC chip (region area: 1200 mm², connecting pad number: 30000) is measured by means of a surface roughness measuring instrument (e.g. "SURFCOM 480A" made by Tokyo Seimitsu or "WYKO N-2500" by Veeco) to examine uneven amount (see FIG. 8) due to the presence or absence of conductor pads. As a result, the uneven amount of the solder resist layer surface becomes 7.2 to 9.8 μm.

Next, a polyethylene terephthalate (PET) film is applied on the surface of the solder resist layer, and the solder resist surface is flattened by applying pressure to the solder resist layer through the polyethylene terephthalate film under the following flattening treatment condition.

(Flattening Treatment Condition)
Press temperature: 60 to 80° C.
Press pressure: 3 to 5 MPa
Press time: 1 to 3 minutes On the surface of the solder resist layer after flattening treatment, the same region as that already measured is measured by the same surface roughness measuring instrument, a degree of unevenness of the solder resist layer surface after flattening treatment is examined. As a result, an amount of unevenness of the flattened surface of the solder resist layer becomes small to about 0.8 (minimum uneven amount) to 3.2 μm (maximum uneven amount).

Figure 8:
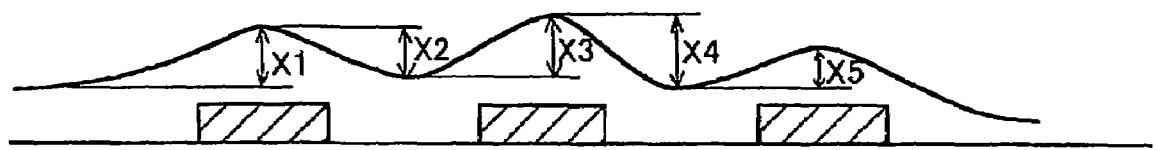
FIG. 8 is a schematic view explaining maximum surface roughness of the solder resist layer surface.

In addition, "maximum uneven amount" and "minimum uneven amount" mentioned herein mean, as shown in FIG. 8, maximum value and minimum value of differences X1, X2, X3, X4, X5 . . . between height of the solder resist layer on the conductor pad or conductor circuit and that of the solder resist layer of adjacent conductor pad non-forming part or conductor circuit non-forming part in the electronic part mounting region.

EXAMPLE 38

Except that after forming a solder resist layer, flattening treatment is applied to the solder resist layer surface with the following condition, a printed wiring board is manufactured in the same manner as in Example 7.

(Flattening Treatment Condition)
Press temperature: 60 to 80° C.
Press pressure: 3 to 5 MPa
Press time: 1 to 3 minutes An uneven amount of the surface before flattening the solder resist layer obtained in this example is comparatively large such as about 6.6 to 10.2 μm, but the amount of the flattened surface is small such as about 0.7 to 3.0 μm.

EXAMPLE 39

Except that after forming a solder resist layer, flattening treatment is applied to the solder resist layer surface with the following condition, a printed wiring board is manufactured in the same manner as in Example 11.

(Flattening Treatment Condition)
Press temperature: 60 to 80° C.
Press pressure: 3 to 5 MPa
Press time: 1 to 3 minutes An uneven amount of the surface before flattening the solder resist layer obtained in this example is comparatively large such as about 8.4 to 9.3 μm, but that of the flattened surface is small such as about 0.8 to 3.1 μm.

EXAMPLE 40

Except that after forming a solder resist layer, flattening treatment is applied to the solder resist layer surface with the following condition, a printed wiring board is manufactured in the same manner as in Example 14.

(Flattening Treatment Condition)
Press temperature: 60 to 80° C.
Press pressure: 3 to 5 MPa
Press time: 1 to 3 minutes An uneven amount of the surface before flattening the solder resist layer obtained in this example is large such as about 8.2 to 9.6 μm, but that of the flattened surface is small such as about 0.7 to 3.2 μm.

EXAMPLE 41

Except that after forming a solder resist layer, flattening treatment is applied to the solder resist layer surface with the following condition, a printed wiring board is manufactured in the same manner as in Example 19.

(Flattening Treatment Condition)
Press temperature: 60 to 80° C.
Press pressure: 3 to 5 MPa
Press time: 1 to 3 minutes An uneven amount of the surface before flattening the solder resist layer obtained in this example is comparatively large such as about 9.9 to 10.2 μm, but that of the flattened surface is small such as about 0.8 to 3.3 μm.

EXAMPLE 42

Except that after forming a solder resist layer, flattening treatment is applied to the solder resist layer surface with the following condition, a printed wiring board is manufactured in the same manner as in Example 23.

(Flattening Treatment Condition)
Press temperature: 60 to 80° C.
Press pressure: 3 to 5 MPa
Press time: 1 to 3 minutes An uneven amount of the surface before flattening the solder resist layer obtained in this example is comparatively large such as about 8.3 to 10.3 μm, but that of the flattened surface is small such as about 0.7 to 3.0 μm.

EXAMPLE 43

Except that after forming a solder resist layer, flattening treatment is applied to the solder resist layer surface with the following condition, a printed wiring board is manufactured in the same manner as in Example 26.

(Flattening Treatment Condition)
Press temperature: 60 to 80° C.
Press pressure: 3 to 5 MPa
Press time: 1 to 3 minutes An uneven amount of the surface before flattening the solder resist layer obtained in this example is comparatively large such as about 9.1 to 9.8 μm, but that of the flattened surface is small such as about 0.5 to 3.1 μm.

EXAMPLE 44

Except that after forming a solder resist layer, flattening treatment is applied to the solder resist layer surface with the following condition, a printed wiring board is manufactured in the same manner as in Example 31.

(Flattening Treatment Condition)
Press temperature: 60 to 80° C.
Press pressure: 3 to 5 MPa
Press time: 1 to 3 minutes An uneven amount of the surface before flattening the solder resist layer obtained in this example is comparatively large such as about 8.1 to 10.2 μm, but that of the flattened surface is small such as about 0.8 to 3.0 μm.

EXAMPLE 45

Except that after forming a solder resist layer, flattening treatment is applied to the solder resist layer surface with the following condition, a printed wiring board is manufactured in the same manner as in Example 35.

(Flattening Treatment Condition)
Press temperature: 60 to 80° C.
Press pressure: 3 to 5 MPa
Press time: 1 to 3 minutes An uneven amount of the surface before flattening the solder resist layer obtained in this example is comparatively large such as about 9.6 to 10.3 μm, but that of the flattened surface is small such as about 0.7 to 3.0 μm.

As to flattened IC mounted printed wiring boards manufactured according to Examples 37 to 45, the same heat cycle test as in Examples 1 to 36 is carried out, electric resistance after 1000 cycles and after 1500 cycles is measured, and a rate of change (100×(measured value−initial value)/initial value (%)) with the initial value is obtained. The case within ±10 is evaluated as "good (O)" and the other cases are evaluated as "no good (x)". This test result is shown in Table 3.

In addition, as to the IC mounted printed wiring boards manufactured according to Examples 2, 7, 11, 14, 19, 23, 26, 31 and 35 applied no flattening treatment, the same heat cycle test is carried out, a rate of change of electric resistance is obtained and evaluated. These test results are also shown in Table 3 with the test results of Examples 37 to 45.

Then, as to the IC mounted printed wiring boards manufactured according to Examples 37 to 45, in which the solder resist layer surface is flattened, their flattened substrates are further roughened with the following condition, thereby manufacturing IC mounted printed wiring boards formed with fine uneven faces (roughened faces) on the flattened surface of the solder resist layer, and these are made Examples 46 to 54.

TABLE 3

| Examples | Amount of unevenness of Flattened Surface of Solder Resist Layer (μm) | | Heat Cycle Test | |
|---|---|---|---|---|
| | Minimum Amount | Maximum Amount | 500 cycles | 1000 cycles |
| Example 37 (2) | 0.8 | 3.2 | O (O) | O (X) |
| Example 38 (7) | 0.7 | 3.0 | O (O) | O (X) |

TABLE 3-continued

| Examples | Amount of unevenness of Flattened Surface of Solder Resist Layer (μm) | | Heat Cycle Test | |
|---|---|---|---|---|
| | Minimum Amount | Maximum Amount | 500 cycles | 1000 cycles |
| Example 39 (11) | 0.8 | 3.1 | ◯ (◯) | ◯ (X) |
| Example 40 (14) | 0.7 | 3.2 | ◯ (◯) | ◯ (X) |
| Example 41 (19) | 0.8 | 3.3 | ◯ (◯) | ◯ (X) |
| Example 42 (23) | 0.7 | 3.0 | ◯ (◯) | ◯ (X) |
| Example 43 (26) | 0.5 | 3.1 | ◯ (◯) | ◯ (X) |
| Example 44 (31) | 0.8 | 3.0 | ◯ (◯) | ◯ (X) |
| Example 45 (35) | 0.7 | 3.0 | ◯ (◯) | ◯ (X) |

EXAMPLE 46

Except that roughening treatment is applied to the solder resist layer surface with the following condition after flattening, a printed wiring board is manufactured in the same manner as in Example 37.

(Roughening Condition)
Roughening solution: potassium permanganate solution
Concentration: 60 to 80 g/l
Temperature: 60 to 80° C.
Immersion time: 1 to 5 minutes After roughening treatment, surface roughness of the solder resist surface is randomly measured at 10 spots by surface roughness measuring instrument (for example, "SURFCOM 480A" made by Tokyo Seimitsu or "WYKO N-2500" made by Veeco). As a result, surface roughness of the surface treated by roughening the solder resist layer becomes small to the extent of about 0.1 to 0.6 μm at Ra.

In addition, "surface roughness (Ra)" mentioned here means "arithmetic mean roughness (Ra)" prescribed by JIS B0601, but Ra within a range of the above measuring result is mentioned that the smallest Ra is Ra(min) and the largest one is Ra(max) in measured 10 spots.

However, surface roughness is measured at random 10 spots in the solder resist layer surface corresponding to the conductor circuit (pad) forming region and the solder resist layer surface corresponding to the conductor circuit non-forming region, but not measured in the boundary vicinity of the conductor circuit forming region and the conductor circuit non-forming region.

EXAMPLE 47

Except that roughening treatment is further applied to the solder resist layer surface with the following condition after flattening treatment, a printed wiring board is manufactured in the same manner as in Example 38.

(Roughening Condition)
Roughening solution: potassium permanganate solution
Concentration: 60 to 80 g/l
Temperature: 60 to 80° C.
Immersion time: 1 to 5 minutes Surface roughness of the roughened surface of the solder resist layer becomes small to the extent of about 0.2 to 0.5 μm (Ra(min) to Ra(max)) at Ra.

EXAMPLE 48

Except that roughening treatment is further applied to the solder resist layer surface with the following condition after flattening treatment, a printed wiring board is manufactured in the same manner as in Example 39.

(Roughening Condition)
Roughening solution: potassium permanganate solution
Concentration: 60 to 80 g/l
Temperature: 60 to 80° C.
Immersion time: 1 to 5 minutes Surface roughness of the roughened solder resist layer surface becomes small to the extent of about 0.2 to 0.5 μm at Ra.

EXAMPLE 49

Except that roughening treatment is further applied to the solder resist layer surface with the following condition after flattening treatment, a printed wiring board is manufactured in the same manner as in Example 40.

(Roughening Condition)
Roughening solution; potassium permanganate solution
Concentration: 60 to 80 g/l
Temperature: 60 to 80° C.
Immersion time: 1 to 5 minutes Surface roughness of the roughened solder resist layer becomes small to the extent of about 0.2 to 0.7 μm at Ra.

EXAMPLE 50

Except that roughening treatment is further applied to the solder resist layer surface with the following condition after flattening treatment, a printed wiring board is manufactured in the same manner as in Example 41.

(Roughening Condition)
Roughening solution; potassium permanganate solution
Concentration: 60 to 80 g/l
Temperature: 60 to 80° C.
Immersion time: 1 to 5 minutes Surface roughness of the roughened solder resist layer becomes small to the extent of about 0.1 to 0.5 μm at Ra.

EXAMPLE 51

Except that roughening treatment is further applied to the solder resist layer surface with the following condition after flattening treatment, a printed wiring board is manufactured in the same manner as in Example 42.

(Roughening Condition)
Roughening solution; potassium permanganate solution
Concentration: 60 to 80 g/l
Temperature: 60 to 80° C.
Immersion time: 1 to 5 minutes Surface roughness of the roughened solder resist layer becomes small to the extent of about 0.1 to 0.5 μm at Ra.

EXAMPLE 52

Except that roughening treatment is further applied to the solder resist layer surface with the following condition after flattening treatment, a printed wiring board is manufactured in the same manner as in Example 43.

(Roughening Condition)
Roughening solution; potassium permanganate solution
Concentration: 60 to 80 g/l
Temperature: 60 to 80° C.
Immersion time: 1 to 5 minutes Surface roughness of the roughened solder resist layer becomes small to the extent of about 0.2 to 0.5 μm at Ra.

EXAMPLE 53

Except that roughening treatment is further applied to the solder resist layer surface with the following condition after flattening treatment, a printed wiring board is manufactured in the same manner as in Example 44.

(Roughening Condition)
Roughening solution; potassium permanganate solution
Concentration: 60 to 80 g/l
Temperature: 60 to 80° C.
Immersion time: 1 to 5 minutes Surface roughness of the roughened solder resist layer becomes small to the extent of about 0.2 to 0.6 μm at Ra.

EXAMPLE 54

Except that roughening treatment is further applied to the solder resist layer surface with the following condition after flattening treatment, a printed wiring board is manufactured in the same manner as in Example 45.

(Roughening Condition)
Roughening solution; potassium permanganate solution
Concentration: 60 to 80 g/l
Temperature: 60 to 80° C.
Immersion time: 1 to 5 minutes Surface roughness of the roughened solder resist layer becomes small to the extent of about 0.1 to 0.5 μm at Ra.

As to the IC mounted printed wiring boards manufactured according to Examples 46 to 54, the same heat cycle test as in Examples 1 to 36 is carried out, electric resistance after 1500 cycles and after 2000 cycles is measured, and a rate of change (100×(measured value−initial value)/initial value (%)) with the initial value is obtained.

The case within ±10 is evaluated as "good (O)" and the other cases are evaluated as "no good (x)". This test result is shown in Table 4.

In addition, as to the IC mounted printed wiring boards manufactured according to Examples 37 to 45 applied no flattening treatment, the same heat cycle test is carried out, a rate of change of electric resistance is obtained and evaluated. These test results are also shown in Table 4 with the test results of Examples 46 to 54.

TABLE 4

| Examples | Roughness of Roughened Surface (μm) | | Heat Cycle Test | |
|---|---|---|---|---|
| | Ra (minimum) | Ra (Maximum) | 1500 cycles | 2000 cycles |
| Example 46 (37) | 0.1 | 0.6 | O (O) | O (X) |
| Example 47 (38) | 0.2 | 0.5 | O (O) | O (X) |
| Example 48 (39) | 0.2 | 0.5 | O (O) | O (X) |
| Example 49 (40) | 0.2 | 0.7 | O (O) | O (X) |
| Example 50 (41) | 0.1 | 0.5 | O (O) | O (X) |
| Example 51 (42) | 0.1 | 0.5 | O (O) | O (X) |
| Example 52 (43) | 0.2 | 0.5 | O (O) | O (X) |
| Example 53 (44) | 0.2 | 0.6 | O (O) | O (X) |
| Example 54 (45) | 0.1 | 0.5 | O (O) | O (X) |

It is understood from the above test result that when a ratio (H/D) of the solder bump height H and the solder resist opening diameter D is within a range of about 0.55 to about 1.0, connection reliability is improved. Further, mainly, it is understood that unevenness of the solder resist layer surface due to the presence or absence of the connecting pad positioned beneath the solder resist is flattened, and when roughness of the flattened surface is about 0.8 to about 3 μm of maximum surface roughness (uneven amount), connection reliability is improved. It is assumed that when the height of a solder bump is comparatively large, a space between the IC chip lower face and the solder resist layer surface becomes wider, so that if there is large unevenness (different level), voids are liable to generate within an under fill resin 100 (sealant), but dispersion of the space between the IC chip lower face and the solder resist layer surface becomes small by flattening treatment so as to increase filling ability of the under fill resin 100.

Further, when fine unevenness formed by roughing treatment is existent on the flattened solder resist layer surface, and roughness of the roughened surface is about 0.2 μm to about 0.5 μm at arithmetic mean roughness Ra, it is understood that connection reliability is further improved. It is assumed that adhesion between the under fill resin 100 and the solder resist layer surface is easily improved, or flux and flux cleaning solvent are hard to remain within a recess of the surface.

(HAST Test)

The printed wiring boards manufactured according to Examples 1 to 54 and Comparative Examples 1 to 24 are left in atmosphere of temperature: 85° C. and humidity: 85% by applying voltage of 3.3V between adjacent and not shorted solder bumps for 50 hours. Thereafter, insulation resistance between the voltage-applied solder bumps is measured.

In addition, when insulation resistance is $10^7$ Ω or more, insulation performance is "good (O)" and when insulation resistance is less than $10^7$ Ω, insulation performance is "no good (x)" for evaluation.

As the result, it is confirmed that insulation performance of Examples 1 to 54 and Comparative Examples 1 to 12 is good (O) and that of Comparative Examples 13 to 24 is no good (x).

(Observation of Voids in Bump)

As to the printed wiring boards manufactured according to Examples 1 to 54, voids within solder bumps are observed by using an X-ray television system ("SMX-100" made by Shimazu Corporation) and number of voids is measured. 100 solder bumps are randomly selected, but no void is observed.

As to the printed wiring boards manufactured according to Examples 1 to 54, except that number of connection pad is changed from about 2000 (connecting pad region: about 150 mm$^2$) to about 30000 (connecting pad region: about 1200 mm$^2$), an IC mounted printed wiring board is manufactured in the same manner as in Examples 1 to 54, each of these examples is conducted to heat cycle test, HAST test and observation of voids in solder bump in the same manner as in Examples 1 to 54, and the same results as Examples 1 to 54 can be obtained.

That is, in high density mounting such as about 2000 to about 30000 connecting pads (connecting region area: about 150 to about 1200 mm$^2$), shear stress due to thermal expansion coefficient difference between the IC chip and the printed wiring board becomes large, but according to the present invention, it is confirmed that a printed wiring board having easily improved connection reliability and insulation reliability is produced.

What is claimed is:

1. A printed wiring board comprising:
   a core substrate having a conductor circuit;
   a build-up multilayer structure formed over the core substrate and having an outermost conductor circuit and an outermost insulative resin layer;

a solder resist layer formed over the outermost conductor circuit and outermost insulative resin layer, the solder resist layer having a plurality of openings for mounting electronic elements;

a plurality of conductor pads formed on the outermost conductor circuit in the plurality of openings of the solder resist layer, respectively; and a plurality of solder bumps formed on plurality of conductor pads, respectively, by loading a plurality of solder balls, respectively, an under fill material or resin which seals a gap or space formed between the electronic elements mounted through the solder bumps and the solder resist layer, wherein the conductor pads are arranged with a pitch of about 200 µm or less and the ratio (H/D) of a height H of the solder bump from the surface of the solder resist layer to an opening diameter D of the opening is about 0.55 to about 1.0, wherein said solder resist layer is flattened in a region where the electronic parts are mounted, and said flattened region of the solder resist layer has an unevenness of between about 0.8 µm and about 3.0 µm, said unevenness determined by calculating the difference between the height of the solder resist layer on a conductor pad and the height of the solder resist layer of an adjacent conductor pad in the flattened region, and wherein said flattened region of the solder resist layer is roughened, and said roughness of the roughened surface of the solder resist layer is smaller than the maximum unevenness of the flattened surface and is about 0.2 µm to about 0.5 µm at an arithmetic mean roughness (Ra).

2. The printed wiring board of claim 1, wherein the conductor pads are formed in filled-viaholes and comprising a plated conductor filled into openings provided in an outermost interlaminar insulative resin layer of the wiring substrate, and the filled-viaholes have surfaces exposed from the interlaminar insulative resin layer which have an unevenness of about −5 µm to about +5 µm in relation to the thickness of the conductor circuit formed on the interlaminar insulative resin layer.

* * * * *